United States Patent [19]
Kuroda et al.

[11] Patent Number: 6,037,805
[45] Date of Patent: Mar. 14, 2000

[54] INTEGRATED CIRCUIT DEVICE HAVING SMALL AMPLITUDE SIGNAL TRANSMISSION

[75] Inventors: Tadahiro Kuroda, Yokohama; Takayasu Sakurai, Setagaya-Ku, both of Japan

[73] Assignee: Kabushiki Kaisha Toshiba, Kanagawa-ken, Japan

[21] Appl. No.: 09/280,726

[22] Filed: Mar. 29, 1999

Related U.S. Application Data

[62] Division of application No. 08/848,126, Apr. 28, 1997, Pat. No. 5,933,029.

[30] Foreign Application Priority Data

Apr. 30, 1996 [JP] Japan ................................ 8-132826
Apr. 7, 1997 [JP] Japan ................................. 9-87963

[51] Int. Cl.⁷ .................. H01L 25/00; H03K 19/00; H03K 19/0175; H03K 19/094
[52] U.S. Cl. ..................... 326/101; 326/103; 326/82; 326/86
[58] Field of Search ............... 326/101, 102, 326/103, 82, 41, 47, 86

[56] References Cited

U.S. PATENT DOCUMENTS

| | | |
|---|---|---|
| 3,648,065 | 3/1972 | Mukai et al. . |
| 4,716,313 | 12/1987 | Hori et al. . |
| 4,733,288 | 3/1988 | Sato .......................... 357/40 |
| 5,086,238 | 2/1992 | Watanabe et al. . |
| 5,111,080 | 5/1992 | Mizukami et al. . |
| 5,369,317 | 11/1994 | Casper et al. . |
| 5,459,412 | 10/1995 | Mentzer . |
| 5,469,081 | 11/1995 | Horita et al. . |
| 5,510,729 | 4/1996 | Reymond . |
| 5,644,245 | 7/1997 | Taylor . |
| 5,661,416 | 8/1997 | Takada et al. . |
| 5,729,154 | 3/1998 | Taguchi et al. . |
| 5,886,539 | 3/1999 | Bell ........................... 326/82 |

FOREIGN PATENT DOCUMENTS

| | | |
|---|---|---|
| 0 432 280 A1 | 6/1991 | European Pat. Off. . |
| 0 517 375 A2 | 12/1992 | European Pat. Off. . |

*Primary Examiner*—Michael Tokar
*Assistant Examiner*—Daniel D. Chang
*Attorney, Agent, or Firm*—Loeb & Loeb LLP

[57] ABSTRACT

To minimize the power consumption, the disclosed semiconductor integrated circuit device, comprises; a bias circuit for generating a predetermined voltage fixed between a first supply voltage and a second supply voltage; a driver circuit for receiving an inversion input signal and a non-inversion input signal each vibrating between the first and second supply voltages, for converting the received input signals into a signal vibrating between an output voltage of the bias circuit and the first supply voltage, and for driving a transfer path by the converted signal; a voltage divider circuit for dividing an output voltage of the bias circuit; and a receiver circuit for detecting the signal for driving the transfer path by use of an output of the voltage divider circuit as a reference voltage, and for converting the detected signal into a signal vibrating between the first supply voltage and the second supply voltage.

10 Claims, 23 Drawing Sheets

FIG. 16A
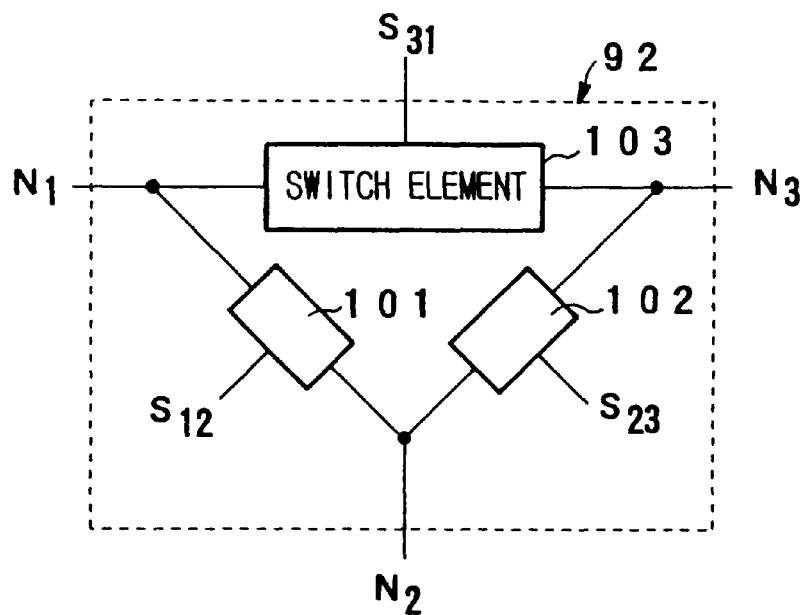
FIG. 16B
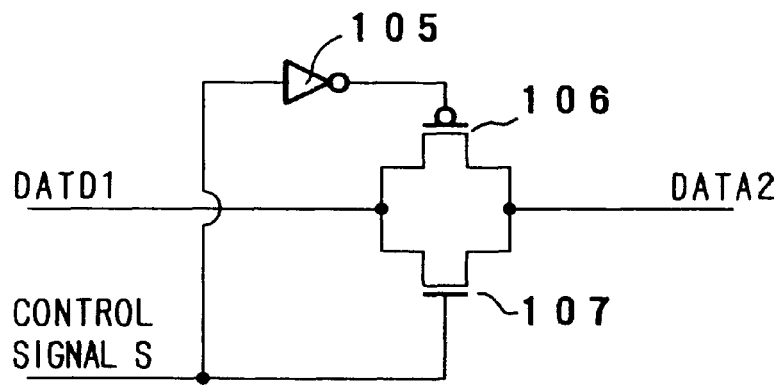
FIG. 16C
| CONTROL SIGNAL | | | CONNECT RELATIONSHIP |
|---|---|---|---|
| $S_{12}$ | $S_{23}$ | $S_{31}$ | |
| 1 | 0 | 0 | CONNECT OF $N_1$ AND $N_2$ |
| 0 | 1 | 0 | CONNECT OF $N_2$ AND $N_3$ |
| 0 | 0 | 1 | CONNECT OF $N_3$ AND $N_1$ |

INTEGRATED CIRCUIT DEVICE HAVING SMALL AMPLITUDE SIGNAL TRANSMISSION

This is a division of application Ser. No. 08/848,126, filed Apr. 28, 1997 and now U.S. Pat. No. 5,933,029.

BACKGROUND OF THE INVENTION

1. Field of the Invention

The present invention relates to a semiconductor integrated circuit device having driver circuits each for driving a bus, a clock line or an input/output line of a semiconductor chip.

2. Description of the Prior Art

The power consumption of a CMOS circuit can be given by the following formula:

$$P = pt \cdot f \cdot CL \cdot Vs \cdot V_{DD} \quad (1)$$

where Vs denotes the signal amplitude; $V_{DD}$ denotes the supply voltage; pt denotes the switching probability; f denote the clock frequency; and CL denotes the load capacitance.

In the ordinary circuit, conventionally since the amplitude of the signal changes between the supply voltage and the ground voltage, the above formula (1) can be expressed as $$P = pt \cdot f \cdot CL \cdot V_{DD}^2 \quad (2)$$

In the ordinary CMOS circuit, however, since there exist relatively large parasitic capacitances in the bus and clock line, or the input/output line of the semiconductor chip, the driver circuits for driving these lines consume a relatively large power, respectively. Recently, therefore, a lower power consumption has been required more and more for the semiconductor integrated circuit device, so that this problem has become an important problem to be solved.

By the way, as understood on the basis of the above formula (1), one of the methods of reducing the power consumption is to reduce the signal amplitude. However, this method is not easy. The reasons are as follows: first, it is difficult to realize the driver circuit for outputting a small amplitude signal under a low power consumption. Or else, it is difficult to realize a receiver circuit for receiving the small-amplitude signal and returning the received small-amplitude signal to the ordinary amplitude signal under a low power consumption.

In addition, in the case of the small-amplitude signal, since the margin against noise is inevitably reduced, it is difficult to prevent erroneous signals from being transmitted. In particular, in the case of the input/output line of the chip, since the signal is susceptible to an influence of signal reflection, there exists a problem of cross talk with the ordinary signals.

Further, there exists a problem of the threshold fluctuations of the receiver circuit due to the change of temperature and the dispersion of device characteristics.

For the reasons as described above, the small-amplitude signals have been so far used for only a part of the circuits whose characteristics are well known (e.g., as with the case of bit line signals of a memory device). In the ordinary semiconductor circuit device, on the other hand, the signals having an amplitude changing between the supply voltage and the ground voltage have been so far used. As a result, there exists a problem in that the power consumption cannot be reduced in the semiconductor integrated circuit device having the driver circuits.

SUMMARY OF THE INVENTION

With these problems in mind, therefore, it is the object of the present invention to provide a semiconductor integrated circuit device having driver circuits of the smallest possible power consumption.

To achieve the above-mentioned object, a first aspect of the present invention provides a semiconductor integrated circuit device, comprising: a bias circuit for generating a predetermined voltage fixed between a first supply voltage and a second supply voltage; a driver circuit for receiving an inversion input signal and a non-inversion input signal each vibrating between the first and second supply voltages, for converting the received input signals into a signal vibrating between an output voltage of said bias circuit and the first supply voltage, and for driving a transfer path by the converted signal; a voltage divider circuit for dividing an output voltage of said bias circuit; and a receiver circuit for detecting the signal for driving the transfer path by use of an output of said voltage divider circuit as a reference voltage, and for converting the detected signal into a signal vibrating between the first supply voltage and the second supply voltage.

Further, a second aspect of the present invention provides a semiconductor integrated circuit device, comprising: a bias circuit for generating a predetermined voltage fixed between a first supply voltage and a second supply voltage; a driver circuit for receiving an inversion input signal and a non-inversion input signal each vibrating between the first and second supply voltages, for converting the received input signals into a signal vibrating between an output voltage of said bias circuit and the first supply voltage on the basis of an enable signal, and for driving a transfer path by the converted signal or for setting an output thereof to a high impedance; a voltage divider circuit for dividing an output voltage of said bias circuit; and a receiver circuit for detecting the signal for driving the transfer path by use of an output of said voltage divider circuit as a reference voltage, and for converting the detected signal into a signal vibrating between the first supply voltage and the second supply voltage.

Further, a third aspect of the present invention provides a semiconductor integrated circuit device, comprising: a bias circuit for generating a predetermined voltage fixed between a first supply voltage and a second supply voltage; a driver circuit for receiving an inversion input signal and a non-inversion input signal each vibrating between the first and second supply voltages, for converting the received input signals into two differential signals each vibrating between an output voltage of said bias circuit and the first supply voltage, and for driving two transfer paths by the two differential signals, respectively; and a receiver circuit for detecting the differential signals for driving the transfer paths, and for converting the detected differential signals into a signal vibrating between the first supply voltage and the second supply voltage.

Further, a fourth aspect of the present invention provides a semiconductor integrated circuit device, comprising: a bias circuit for generating a predetermined voltage fixed between a first supply voltage and a second supply voltage; a driver circuit for receiving an inversion input signal and a non-inversion input signal each vibrating between the first and second supply voltages, for converting the received input signals into two differential signals each vibrating between an output voltage of said bias circuit and the first supply voltage on the basis of an enable signal, and for driving two transfer paths by the two differential signals or for setting two outputs thereof to a high impedance, respectively; and a receiver circuit for detecting the differential signals for driving the transfer paths, and for converting the detected differential signals into a signal vibrating between the first supply voltage and the second supply voltage.

Further, a fifth aspect of the present invention provides a semiconductor integrated circuit device, comprising: a first semiconductor chip including: a bias circuit for generating a predetermined voltage fixed between a first supply voltage and a second supply voltage; a first driver circuit for receiving a first inversion input signal and a first non-inversion input signal each vibrating between the first and second supply voltages, for converting the received input signals into a signal vibrating between an output voltage of said bias circuit and the first supply voltage on the basis of a first enable signal, and for outputting the converted signal or for setting an output thereof to a high impedance; a first voltage divider circuit for dividing an output voltage of said bias circuit; and a first receiver circuit; and a second semiconductor chip including: a second voltage divider circuit having an input end connected to an input end of said first voltage divider circuit via a wire, for dividing an output voltage of said bias circuit; a second driver circuit having an output end connected to an output end of said first driver circuit via a transfer wire, for receiving a second inversion input signal and a second non-inversion input signal each vibrating between the first and second supply voltages, for converting the received input signals into a signal vibrating between an output voltage of said bias circuit and the first supply voltage on the basis of a second enable signal, and for outputting the converted signal or for setting an output thereof to a high impedance; and a second receiver circuit; and wherein: said first receiver circuit is activated, when the output of said first driver circuit is at the high impedance, to detect a signal transferred from said second driver circuit via the transfer wire and further to convert the detected signal into a signal vibrating between the first supply voltage and the second supply voltage; and said second receiver circuit is activated, when the output of said second driver circuit is at the high impedance, to detect a signal transferred from said first driver circuit via the transfer wire and further to convert the detected signal into a signal vibrating between the first supply voltage and the second supply voltage.

Further, a sixth aspect of the present invention provides a semiconductor integrated circuit device, comprising: a first semiconductor chip including: a first bias circuit for generating a predetermined fixed voltage between a first supply voltage and a second supply voltage; a first driver circuit for receiving a first inversion input signal and a first non-inversion input signal each vibrating between the first and second supply voltages, for converting the received input signals into two differential signals each vibrating between an output voltage of said first bias circuit and the first supply voltage on the basis of a first enable signal, and for outputting the converted differential signals or setting two outputs thereof to a high impedance, respectively; and a first receiver circuit; and a second semiconductor chip including: a second bias circuit for generating another predetermined voltage fixed between a third supply voltage and a fourth supply voltage; a second driver circuit for receiving a second inversion input signal and a second non-inversion input signal each vibrating between the third and fourth supply voltages, for converting the received input signals into two differential signals each vibrating between an output voltage of said second bias circuit and the third supply voltage on the basis of a second enable signal, and for outputting the converted differential signals or setting two outputs thereof to a high impedance, respectively; and a second receiver circuit; and wherein: two output ends of each of said first and second driver circuits are connected to each other by a transfer wire, respectively; said first receiver circuit is activated, when the output of said first driver circuit is at the high impedance, to detect the two differential signals transferred from said second driver circuit via the transfer wires and further to convert the detected difference signals into a signal vibrating between the first supply voltage and the second supply voltage; and said second receiver circuit is activated, when the output of said second driver circuit is at the high impedance, to detect the two differential signals transferred from said first driver circuit via the transfer wire and further to convert the detected differential signals into a signal vibrating between the third supply voltage and the fourth supply voltage.

Further, a seventh aspect of the present invention provides a semiconductor integrated circuit device, which comprises: a plurality of semiconductor chips arranged in a matrix pattern, each semiconductor chip including: input/output ends connected to input/output ends of another adjacent semiconductor chip by transfer wires of bonding wires or substrate wires, respectively, for transferring data; and a small-amplitude input/output circuit arranged in each of the input/output ends of a part or all of said semiconductor chips, for receiving a non-inversion signal and an inversion signal each vibrating between a first supply voltage and a second supply voltage according to each semiconductor chip including the small-amplitude input/output circuit, for converting the received signals into a small-amplitude signal vibrating between a predetermined voltage fixed between the first and second supply voltages and the first supply voltage, for outputting the converted signal to the input/output end of another adjacent semiconductor chip via the transfer wire, and for converting the small-amplitude signal transferred via the transfer wire into a signal vibrating between the first supply voltage and the second supply voltage.

Further, an eighth aspect of the present invention provides a semiconductor integrated circuit device, comprising: first to n-th semiconductor chips arranged in a line, said first semiconductor chip including: first functioning means having predetermined processing functions; a first input/output end for transferring data; and a first small-amplitude input/output circuit for converting an output of said first functioning means into a small-amplitude signal having an amplitude smaller than that of the output signal of said first functioning means, for transferring the converted small-amplitude signal to the adjacent second semiconductor chip via said first input/output end, for converting a small-amplitude signal transferred from the second semiconductor chip via said first input/output end into a large-amplitude signal having an amplitude larger than that of the transferred small-amplitude signal, and for transferring the converted large-amplitude signal to said first functioning means; said i-th (i=2, . . . , n−1) semiconductor chip including: i-th functioning means having predetermined processing functions; 2(i−1)-th and (2i−1)-th input/output ends each for transferring data; 2(i−1)-th and (2i−1)-th small-amplitude input/output circuits; and an (i−1)-th switch circuit; said (i−1)-th switch circuit transferring an output of said i-th functioning means to the 2(i−1)-th or the (2i−1)-th small-amplitude input/output circuit on the basis of a control signal, and selectively outputting an output of one of the 2(i−1)-th and (2i−1)-th small-amplitude input/output circuits to the i-th functioning means or bypasses the same output to the other of the 2(i−1)-th and the (2i−1)-th small-amplitude input/output circuits on the basis of the same control signal; the 2(i−1)-th small-amplitude input/output circuit converting an output of said (i−1)-th switch circuit into a small-amplitude signal having an amplitude smaller than that of the output signal, transferring the converted small-amplitude signal to the (i−1)-th semiconductor chip via said 2(i−1)-th input/output end, converting a small-amplitude signal transferred from the (i−1)-th semiconductor chip via the 2(i−1)-th input/output end into a large-amplitude signal having an amplitude larger than that of the transferred signal, and transferring the converted large-amplitude signal to said (i+1)th switch circuit; and the (2i−1)-th small-amplitude input/output circuit converting an output of said (i−1)-th switch circuit into a small-amplitude signal having an amplitude smaller than that of the output signal, transferring the converted small-amplitude signal to the (i+1)-th semiconductor chip via said (2i−1)-th input/output end, converting a small-amplitude signal transferred from the (i+1)-th semiconductor chip via the (2i−1)-th input/output end into a large-amplitude signal having an amplitude larger than that of the transferred signal, and transferring the converted large-amplitude signal to said (i−1)-th switch circuit; said n-th semiconductor chip including: n-th functioning means having predetermined processing functions; 2(n−1)-th input/output end for transferring data; and 2(n−1)-th small-amplitude input/output circuit for converting an output of said n-th functioning means into a small-amplitude signal having an amplitude smaller than that of the output, for transferring the converted signal to the adjacent (n−1)-th semiconductor chip via the 2(n−1)-th input/output end, for converting the small-amplitude signal transferred from the (n−1)-th semiconductor chip via the 2(n−1)-th input/output end into a large-amplitude signal having an amplitude larger than that of the small-amplitude signal, and for transferring the converted signal to the n-th functioning means; and the (2i−1)-th input/output end of said i-th (i=1, . . . , n−1) semiconductor chip being connected to the 2i-th input/output end of said (i+1)-th semiconductor chip by a transfer wire of a bonding wire or a substrate wire.

Further, a ninth aspect of the present invention provides a semiconductor integrated circuit device, comprising: first to n-th semiconductor chips arranged in a line, said first semiconductor chip including: first functioning means having predetermined processing functions; a first input/output end for transferring data; and a first small-amplitude input/output circuit for converting an output of said first functioning means into a small-amplitude signal having an amplitude smaller than that of the output signal, for transferring the converted small-amplitude signal to the adjacent second semiconductor chip via said first input/output end, for converting a small-amplitude signal transferred from the second semiconductor chip via the first input/output end into a large-amplitude signal having an amplitude larger than that of the transferred small-amplitude signal, and for transferring the converted large-amplitude signal to said first functioning means; said i-th (i=2, . . . , n−1) semiconductor chip including: i-th functioning means having predetermined processing functions; 2(i−1)-th and (2i−1)-th input/output ends each for transferring data; 2(i−1)-th and (2i−1)-th small-amplitude input/output circuits; and 2(i−1)-th and (2i−1)-th selector circuits; and said 2(i−1)-th small-amplitude input/output circuit converting a small-amplitude signal transferred from the adjacent (i−1)-th semiconductor chip via the 2(i−1)-th input/output end into a large-amplitude signal having an amplitude larger than that of the small-amplitude signal, transferring the converted signal to the 2(i−1)-th selector circuit, converting the signal transferred from the 2(i−1)-th selector circuit into a signal having an amplitude smaller than that of the selector signal, and transferring the converted signal to the (i−1)-th semiconductor chip via the 2(i−1)-th input/output end; said (2i−1)-th small-amplitude input/output circuit converting a small-amplitude signal transferred from the adjacent (i+1)-th semiconductor chip via the (2i−1)-th input/output end to a large-amplitude signal having an amplitude larger than that of the small-amplitude signal, transferring the converted signal to the (2i−1)-th selector circuit, converting the signal transferred from the (2i−1)-th selector circuit into a signal having an amplitude smaller than that of the selector signal, and transferring the converted signal to the (i+1)-th semiconductor chip via the (2i−1)-th input/output end; the 2(i−1)-th selector circuit transferring an output of the i-th functioning means and a signal of the (2i−1)-th selector circuit to the 2(i−1)-th small-amplitude input/output circuit, and selectively transferring a signal from the 2(i−1)-th small-amplitude input/output circuit to the i-th functioning means or the (2i−1)-th selector circuit on the basis of a control signal; the (2i−1)-th selector circuit transferring an output of the i-th functioning means and a signal of the 2(i−1)-th selector circuit to the (2i−1)-th small-amplitude input/output circuit, and selectively transferring a signal from the (2i−1)-th small-amplitude input/output circuit to the i-th functioning means or the 2(i−1)-th selector circuit on the basis of the control signal; said n-th semiconductor chip including: n-th functioning means having predetermined processing functions; 2(n−1)-th input/output end for transferring data; and 2(n−1)-th small-amplitude input/output circuit for converting an output of said n-th functioning means into a small-amplitude signal having an amplitude smaller than that of the output, for transferring the converted signal to the adjacent (n−1)-th semiconductor chip vial the 2(n−1)-th input/output end, for converting the small-amplitude signal transferred from the (n−1)-th semiconductor chip via the 2(n−1)-th input/output end into a large-amplitude signal having an amplitude larger than that of the small-amplitude signal, and for transferring the converted signal to the n-th functioning means.

BRIEF DESCRIPTION OF THE DRAWINGS

FIG. 16A is a block diagram showing a switch circuit related to a semiconductor chip shown in FIG. 15B;

FIG. 16B is a circuit diagram showing a structure of each switch element shown in FIG. 16A;

FIG. 16C is a table for listing the connection relationship of the respective nodes on the basis of the control signals applied to the respective switch elements shown in FIG. 16A;

DETAILED DESCRIPTION OF THE PREFERRED EMBODIMENTS

Some embodiments of the semiconductor integrated circuit device according to the present invention will be described hereinbelow with reference to the attached drawings.

1st Embodiment

Figure 1:
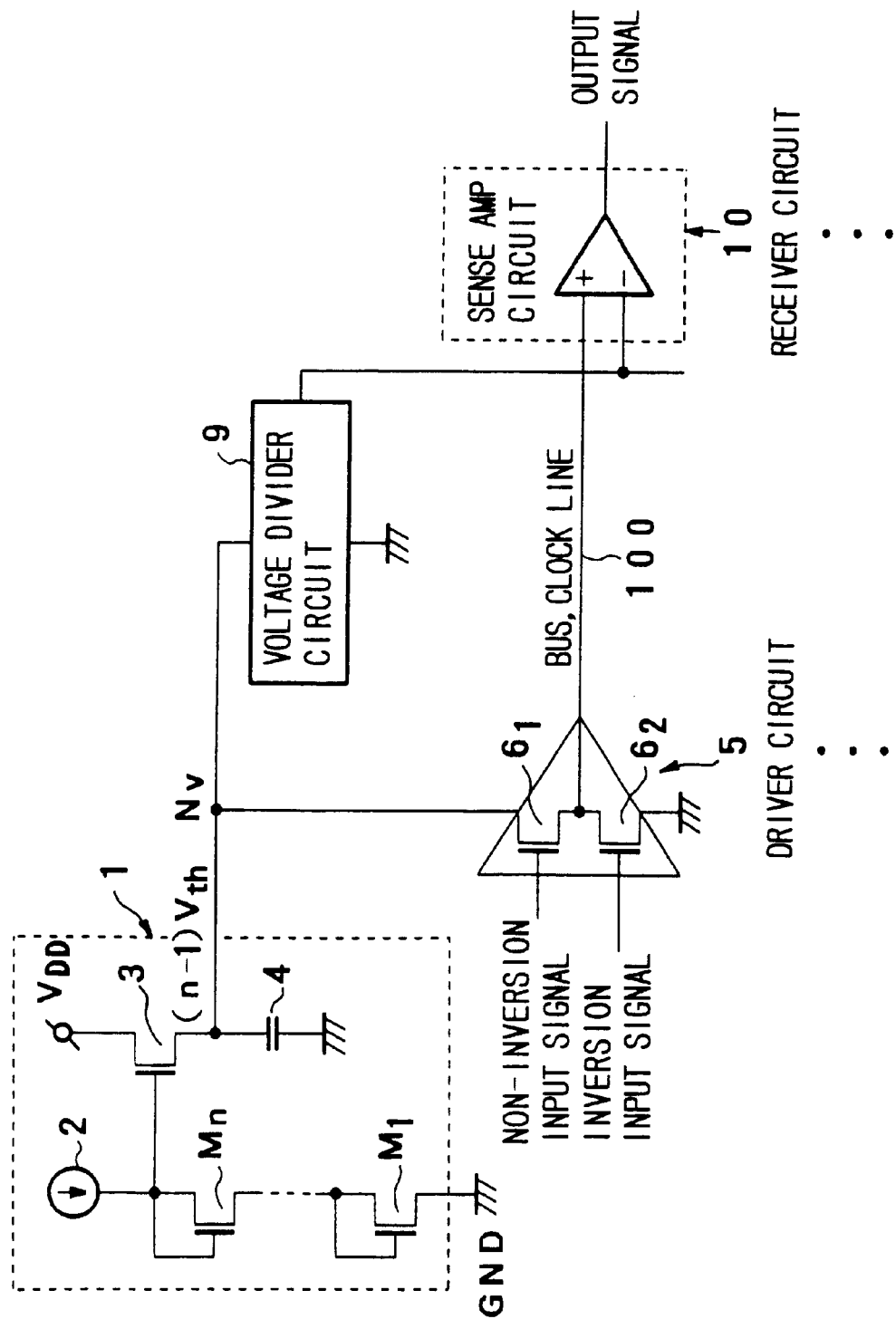
FIG. 1 is a block diagram showing a first embodiment of the semiconductor integrated circuit device according to the present invention.

FIG. 1 shows a first embodiment thereof, which comprises a small-amplitude output circuit having a bias circuit 1 and a driver circuit 5, a voltage divider circuit 9, and a receiver circuit 10 having a sense amplifier circuit.

The bias circuit 1 generates a predetermined voltage, which comprises a current source 2, a series circuit constructed by connecting an n-units of N-channel MOS transistors $M_1, M_2, \ldots, M_n$ of the same size in series, an N-channel MOS transistor 3, and a capacitor 4. Each gate terminal of each transistor $M_i$ (i=1, ..., n) is connected to each drain terminal thereof; the drain terminal of the transistor $M_n$ is connected to an output terminal of the current source 2; and the source terminal of the transistor $M_1$ is grounded. On the other hand, the drain terminal of the transistor 3 is connected to a drive voltage supply $V_{DD}$; the gate terminal thereof is connected to the drain terminal of the transistor $M_n$; and the source terminal thereof is grounded via the capacitor 4.

Therefore, when each threshold voltage of each transistor $M_i$ (i=1, ..., n) is denoted by $V_{th}$, the voltage at the drain terminal of the transistor $M_n$ is $n \cdot V_{th}$.

Further, since the threshold voltage of the transistor 3 can be set to $V_{th}$, the voltage at the source terminal of the transistor 3; that is, the voltage at the output terminal $N_V$ of the bias circuit 1 can be set to a constant voltage of $(n-1) \cdot V_{th}$. Further, when the capacitor 4 is connected to stabilize the voltage at the output terminal of the bias circuit 1, it is possible to improve the transient response of the output of the driver circuit 1. However, this capacitor 4 can be omitted.

The driver circuit 5 receives a non-inversion input signal and an inversion input signal both vibrating between the drive voltage $V_{DD}$ and the ground voltage GND, converts the received input signals into a small-amplitude signal vibrating between the output voltage of the bias circuit 1 and the ground voltage GND, and drives a transfer path 100 such as a bus, a clock line, etc. on the basis of the converted small-amplitude signal.

The driver circuit 5 comprises two series-connected N-channel MOS transistors $6_1$ and $6_2$. The drain of the transistor $6_1$ is connected to the output terminal $N_V$ of the bias circuit; the source thereof is connected to the drain of the transistor $6_2$; and the gate thereof receives a non-inversion input signal. Further, the source of the transistor $6_2$ is grounded; and the gate thereof receives an inversion input signal. Further, an output signal of the driver circuit 5 is outputted from a junction point between the two transistors $6_1$ and $6_2$ to the transfer path 100.

Figure 3:
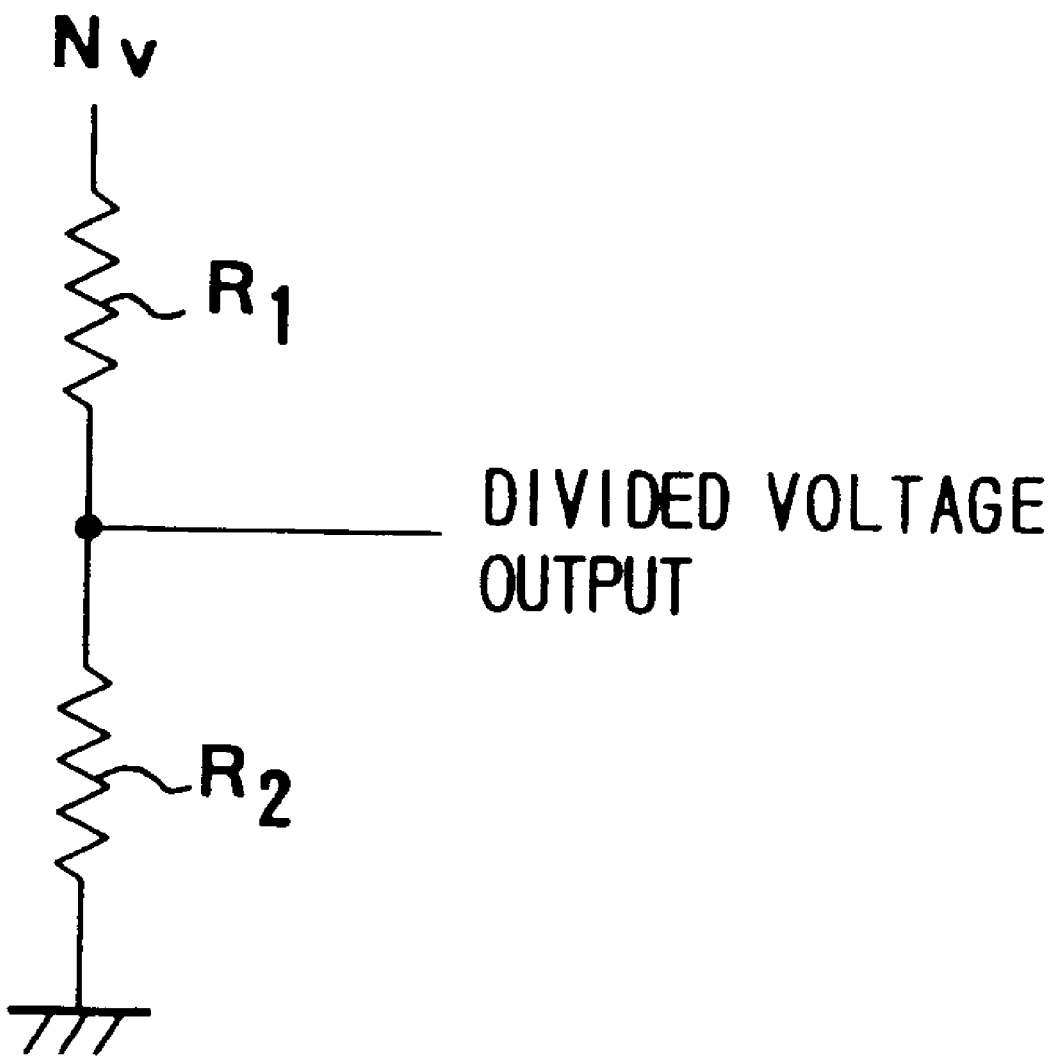
FIG. 3 is a circuit diagram showing a practical example of a voltage divider circuit of the first and second embodiments of the semiconductor integrated circuit device according to the present invention.

The voltage divider circuit 9 divides the output voltage of the bias circuit 1, which can be constructed by a plurality of series-connected resistors (e.g., $R_1$ and $R_2$ as shown in FIG. 3).

The receiver circuit 10 detects the small-amplitude signal transmitted through the transfer path 100 by a sense amplifier circuit by use of the output voltage of the voltage divider circuit 9 as a reference voltage, and converts the detected small-amplitude signal into a signal vibrating between the drive voltage $V_{DD}$ and the ground voltage GND.

As described above, in the first embodiment of the semiconductor integrated circuit device according to the present invention, it is possible to convert the output of the driver circuit 5 for driving the transfer path 100 such as the bus, the clock line, etc. into the small-amplitude signal. In general, the power consumption of the driver circuit is proportional to the amplitude of the output signal. Therefore, the power consumption of this first embodiment can be reduced in comparison with that of the prior art semiconductor integrated circuit device.

Further, in the above-mentioned embodiment, although a plurality of N-channel transistors are of the same size in the series-connected circuit of the bias circuit 1, the series-connected circuit thereof can be composed of a plurality of N-channel transistors of different sizes.

2nd Embodiment

Figure 2:
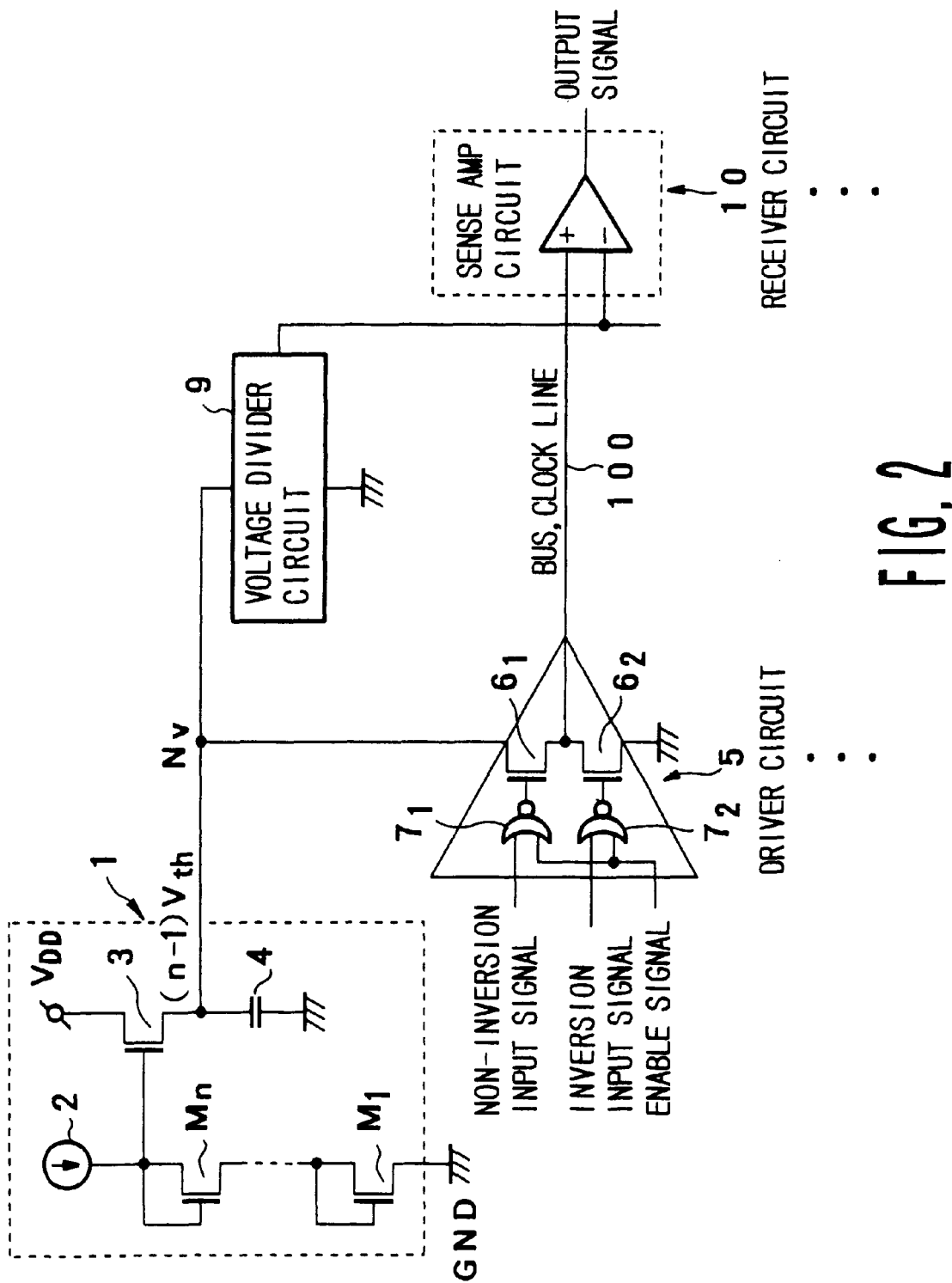
FIG. 2 is a block diagram showing a second embodiment of the semiconductor integrated circuit device according to the present invention.

FIG. 2 shows a second embodiment of the semiconductor integrated circuit device according to the present invention, which is different from the first embodiment shown in FIG. 1 in that two NOR gates $7_1$ and $7_2$ are additionally connected in the driver circuit 5.

The NOR gate $7_1$ executes NOR operation on the basis of the non-inversion input signal and an enable signal, and transmits the operation result to the gate of the transistor $6_1$. On the other hand, the NOR gate $7_2$ executes NOR operation on the basis of the inversion input signal and the same enable signal, and transmits the operation result to the gate of the transistor $6_2$.

Therefore, in this second embodiment, when the enable signal is at an L-level, the operation is the same as with the case of that of the first embodiment. On the other hand, when the enable signal is at an H-level, the output of the driver circuit 5 is set to a high impedance.

In this second embodiment, it is of course possible to obtain the same effect as with the case of the first embodiment.

3rd Embodiment

Figure 4:
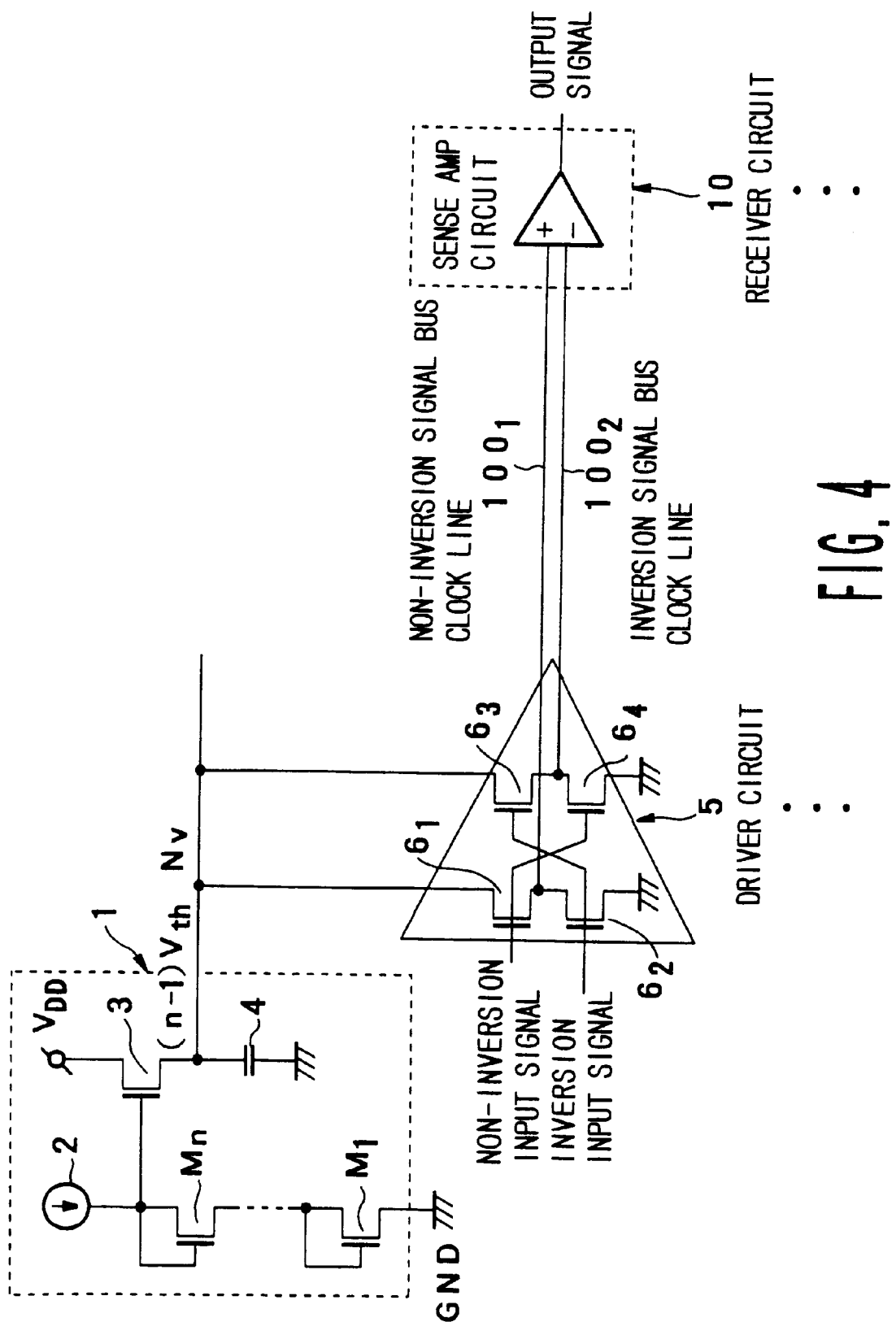
FIG. 4 is a block diagram showing a third embodiment of the semiconductor integrated circuit device according to the present invention.

FIG. 4 shows a third embodiment of the semiconductor integrated circuit device according to the present invention, which is different from the first embodiment shown in FIG. 1 in that the voltage divider circuit 9 is omitted and further two series-connected N-channel MOS transistors $6_3$ and $6_4$ are additionally connected in the driver circuit 5.

The drain of the transistor $6_3$ is connected to the output terminal of the bias circuit 1; the source thereof is connected to the drain of the transistor $6_4$; and the gate thereof receives the inversion input signal. On the other hand, the source of the transistor $6_4$ is grounded; and the gate thereof receives the non-inversion input signal.

Further, the non-inversion small-amplitude signal can be transmitted from the junction point between the two transistors $6_1$ and $6_2$ to the receiver circuit 10 via the transfer path $100_1$. On the other hand, the inversion small-amplitude signal can be transmitted from the junction point between the two transistors $6_3$ and $6_4$ to the receiver circuit 10 via the transfer path $100_2$.

Therefore, in this third embodiment, the driver circuit can drive the two transfer paths $100_1$ and $100_2$ by a differential signal vibrating between a predetermined voltage of $(n-1) \cdot V_{th}$ and the ground voltage GND. Further, the receiver circuit 10 detects the differential signal transmitted through the two transfer paths $100_1$ and $100_2$ by the sense amplifier circuit, and further converts the detected differential signal into a signal vibrating between the drive voltage $V_{DD}$ and the ground voltage GND.

In this third embodiment, it is of course possible to obtain the same effect as with the case of the first embodiment and further to minimize the power consumption.

Further, in this third embodiment, although two transfer paths are needed, since the reference voltage applied to the sense amplifier circuit is not needed, it is possible to obtain a wide operation margin against the same-phase noise.

4th Embodiment

Figure 5:
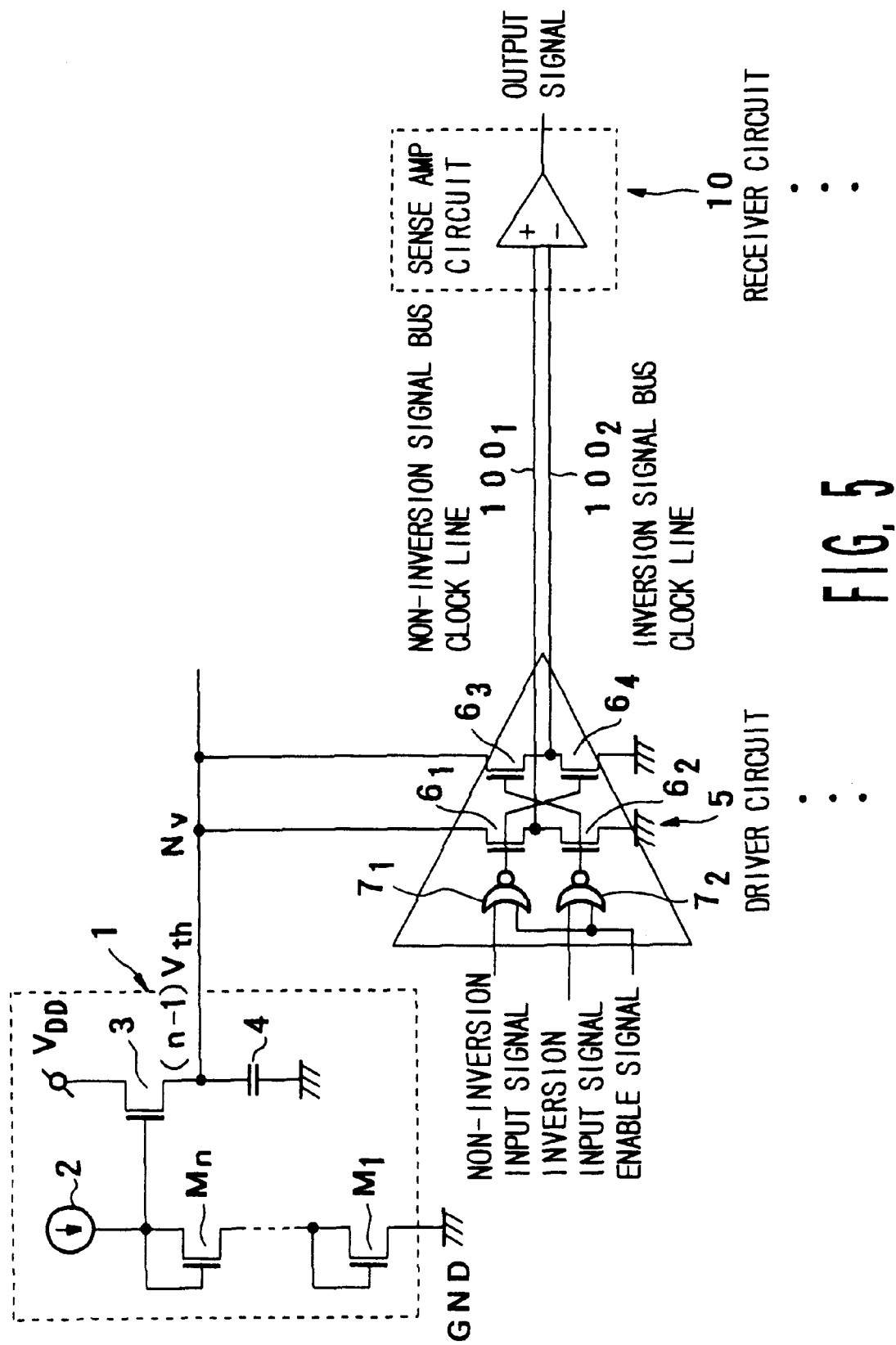
FIG. 5 is a block diagram showing a fourth embodiment of the semiconductor integrated circuit device according to the present invention.

FIG. 5 shows a fourth embodiment of the semiconductor integrated circuit device according to the present invention, which is different from the third embodiment shown in FIG. 4 in that two NOR gates $7_1$ and $7_2$ are additionally connected in the driver circuit 5.

The NOR gate $7_1$ executes NOR operation on the basis of the non-inversion input signal and an enable signal, and transmits the operation result to the gates of the two transistors $6_1$ and $6_4$. On the other hand, the NOR gate $7_2$ executes NOR operation on the basis of the inversion input signal and the same enable signal, and transmits the operation result to the gates of the two transistor $6_2$ and $6_3$.

Therefore, in this fourth embodiment, when the enable signal is at the L-level, the operation is the same as with the case of that of the third embodiment. On the other hand, when the enable signal is at the H-level, the output of the driver circuit 5 is set to a high impedance.

In this fourth embodiment, it is of course possible to obtain the same effect as with the case of the first embodiment and further to minimize the power consumption.

Figure 6:
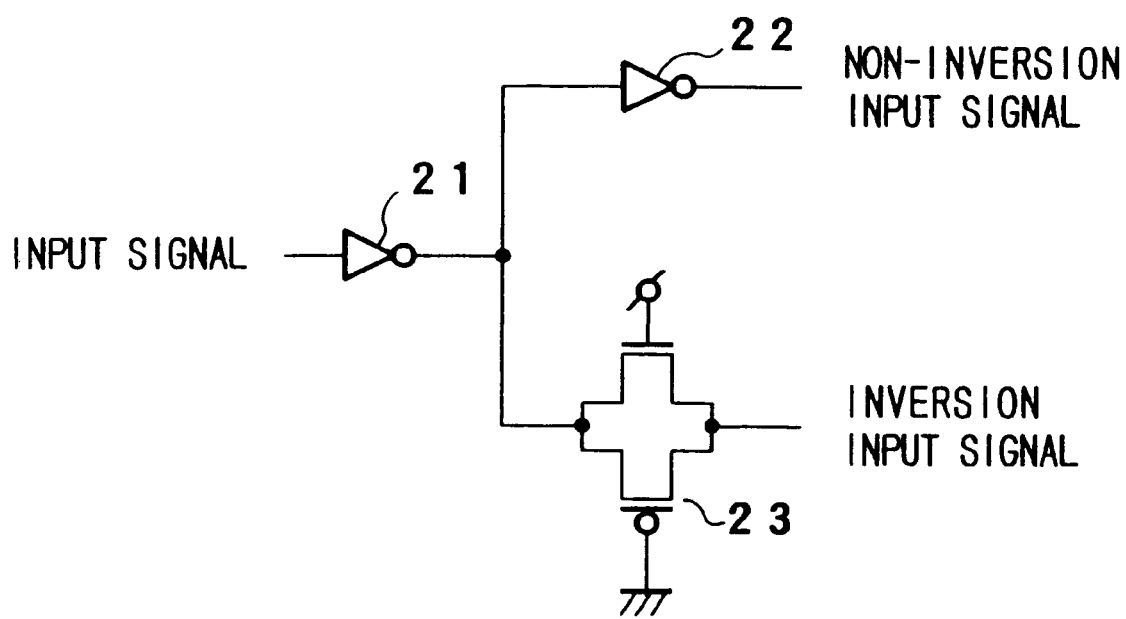
FIG. 6 is a circuit diagram showing a circuit for generating two input signals applied to the driver circuit related to the semiconductor integrated circuit device according to the present invention.

The non-inversion input signal and the inversion input signal used in the first to fourth embodiments can be generated by a circuit as shown in FIG. 6. The circuit shown in FIG. 6 is composed of two inversion gates 21 and 22, and a transfer gate 23 made up of a P-channel MOS transistor and an N-channel MOS transistor.

Figure 7:
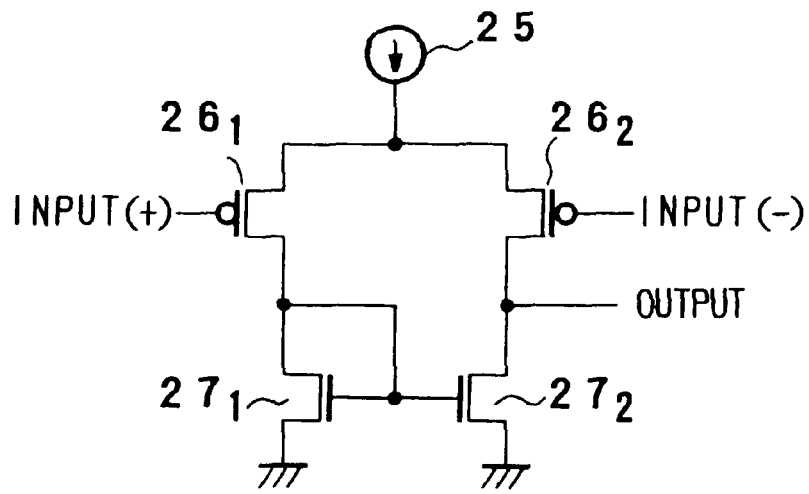
FIG. 7 is a circuit diagram showing a practical example of a sense amplifier circuit of a receiver circuit related to the semiconductor integrated circuit device according to the present invention.

Further, the sense amplifier circuit used for the first to fourth embodiments can be constructed by a circuit as shown in FIG. 7. The circuit shown in FIG. 7 is composed of a current source 25, two P-channel MOS transistors $26_1$ and $26_2$ for receiving a differential input signal, and two N-channel MOS transistors $27_1$ and $27_2$. Further, in the case of the first and second embodiments, the output of the voltage divider circuit 9 is inputted to the gate of the transistor $26_2$.

Figure 8:
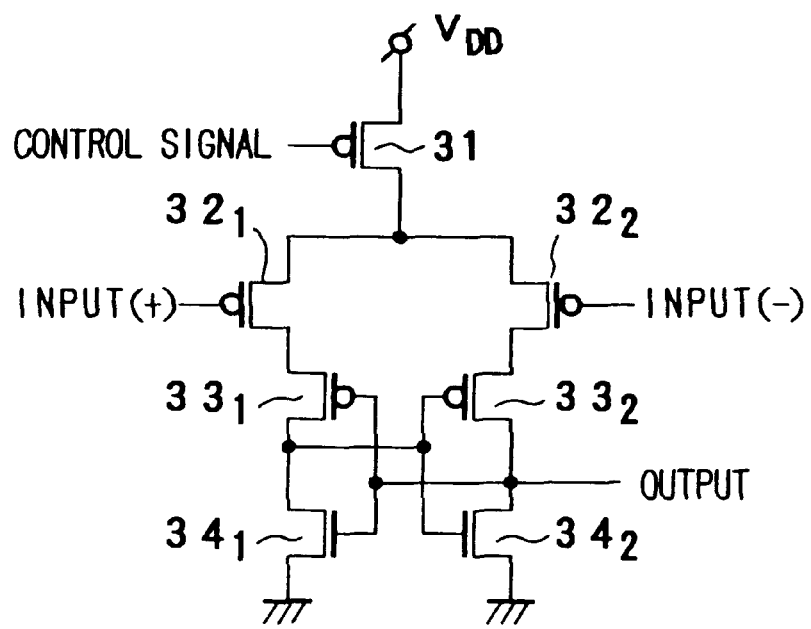
FIG. 8 is a circuit diagram showing another practical example of the sense amplifier circuit of the receiver circuit related to the semiconductor integrated circuit device according to the present invention.

In the same way, the sense amplifier circuit can be constructed as shown in FIG. 8. The sense amplifier shown in FIG. 8 is composed of a P-channel MOS transistor 31 for receiving a control signal at the gate thereof; two P-channel MOS transistors $32_1$ and $32_2$ for receiving a differential input signal at the gate thereof; two common-gate and series-connected P-channel MOS transistor $33_1$ and N-channel MOS transistor $34_1$; and two common-gate and series-connected P-channel MOS transistor $33_2$ and N-channel MOS transistor $34_2$.

5th Embodiment

Figure 9:
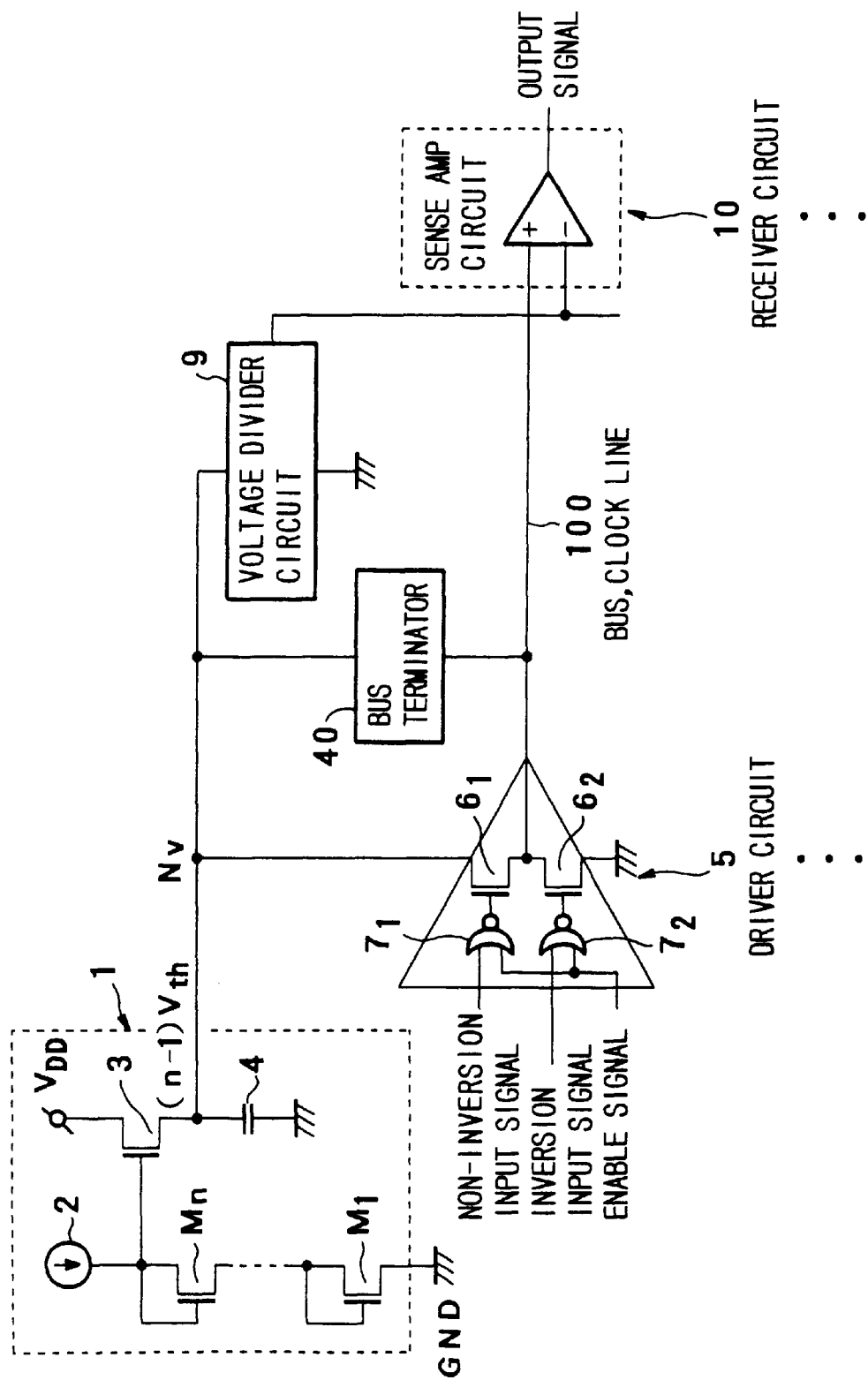
FIG. 9 is a block diagram showing a fifth embodiment of the semiconductor integrated circuit device according to the present invention.

FIG. 9 shows a fifth embodiment of the semiconductor integrated circuit device according to the present invention, which is different from the second embodiment shown in FIG. 2 in that a bus terminator circuit 40 is additionally connected between the output terminal of the bias circuit 1 and the transfer path 100. This bus terminator circuit 40 can maintain the voltage at the transfer path 100 (e.g., bus) when the output of the driver circuit 5 is set to a high impedance.

Figure 10:
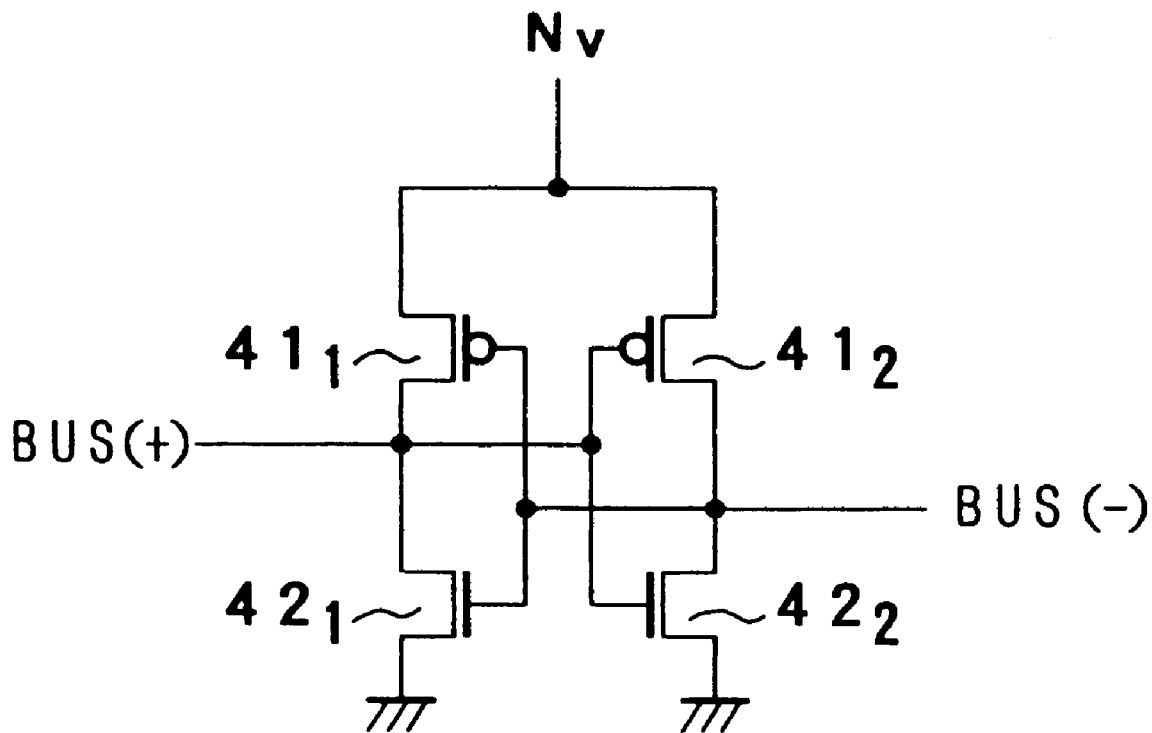
FIG. 10 is a circuit diagram showing a practical example of a bus terminator circuit used for the fifth embodiment of the semiconductor integrated circuit device according to the present invention.

As shown in FIG. 10, this bus terminator circuit 40 can be constructed by two P-channel MOS transistors $41_1$ and $41_2$, and two N-channel MOS transistors $42_1$ and $42_2$. The source of the transistor $41_1$ (i=1 and 2) is connected to the output terminal $N_V$ of the bias circuit 1; the gate thereof is connected to the gate of the transistor $42_i$ (i=1 and 2); and the drain thereof is connected to the drain of the transistor $42_i$. Further, the source of the transistor $42_i$ (i=1 and 2) is grounded. Further, the drains of the two transistors $41_1$ and $42_1$ are connected to the gates of the two transistors $41_2$ and $42_2$. On the other hand, the drains of the two transistors $41_2$ and $42_2$ are connected to the gates of the two transistors $41_1$ and $42_1$. Further, the drains of the two transistors $41_1$ and $42_1$ are connected to the transfer path 100.

In this third embodiment, it is of course possible to obtain the same effect as with the case of the first embodiment and further to minimize the power consumption. Further, it is possible to maintain the voltage at the transfer path 100 (e.g., bus) at a predetermined voltage, when the output of the driver circuit 5 is set to a high impedance.

6th Embodiment

Figure 11:
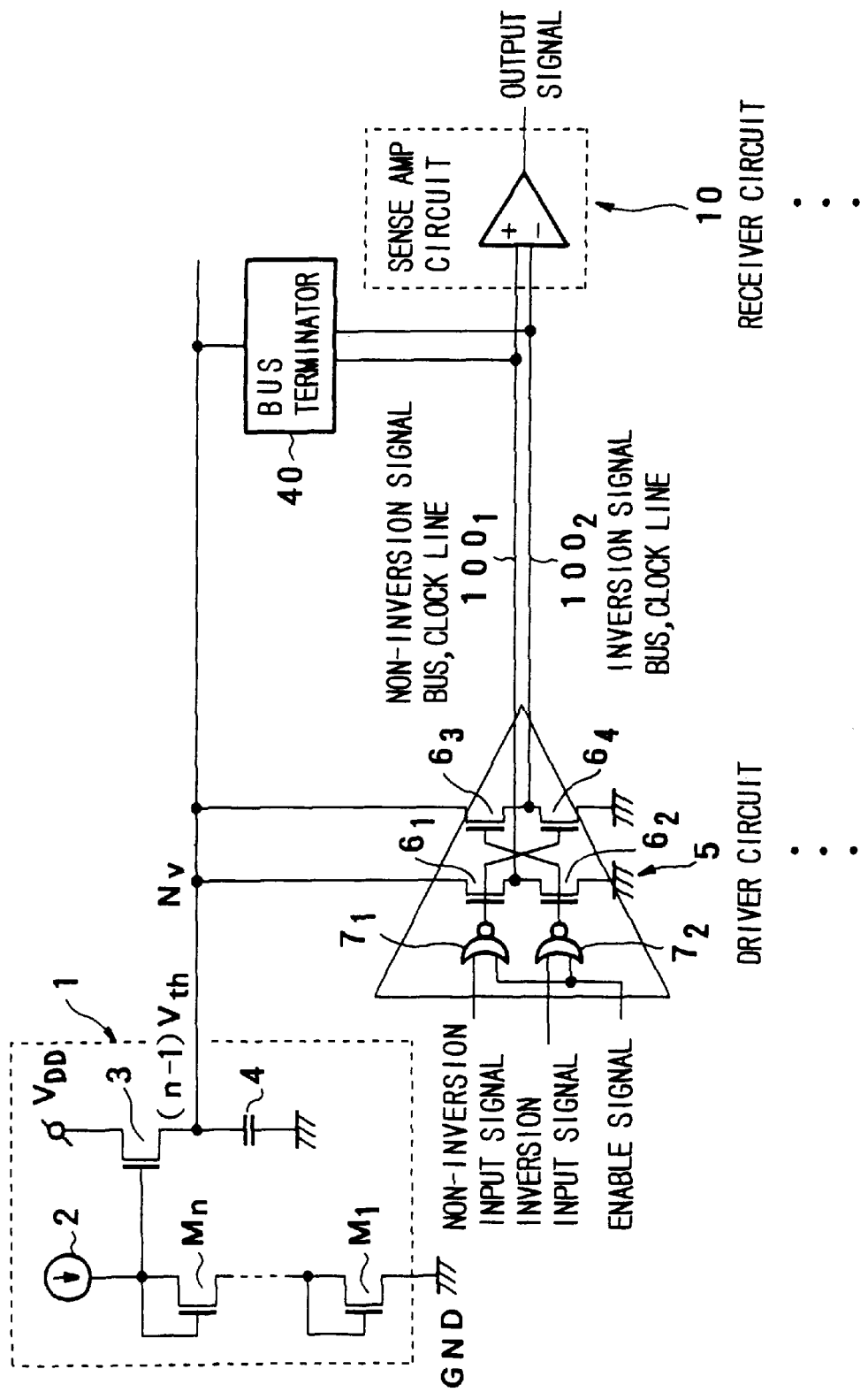
FIG. 11 is a block diagram showing a sixth embodiment of the semiconductor integrated circuit device according to the present invention.

FIG. 11 shows a sixth embodiment of the semiconductor integrated circuit device according to the present invention, which is different from the fourth embodiment shown in FIG. 5 in that a bus terminator circuit 40 is additionally connected between the output terminal of the bias circuit 1 and the two transfer paths $100_1$ and $100_2$. In the same way as with the case of the fifth embodiment, this bus terminator circuit 40 can maintain the voltages at the two transfer paths $100_1$ and $100_2$, respectively when the two outputs of the driver circuit 5 are set to a high impedance, respectively.

This bus terminator circuit 40 can be constructed as shown in FIG. 10. In this case, the transfer path $100_1$ is connected to the drains of the two transistors $41_1$ and $42_1$, and the transfer path $100_2$ is connected to the drains of the two transistors $41_2$ and $42_2$, respectively.

In this sixth embodiment, it is possible to minimize the power consumption, as with the case of the fourth embodiment. Further, it is possible to maintain the voltages at the two transfer paths $100_1$ and $100_2$ at a predetermined voltage, respectively, when the outputs of the driver circuit 5 are set to a high impedance, respectively.

Further, in the first to sixth embodiments, the driver circuit 5 and the receiver circuit 10 can be driven by the same voltage supply or two different voltage supplies.

7th Embodiment

Figure 12:
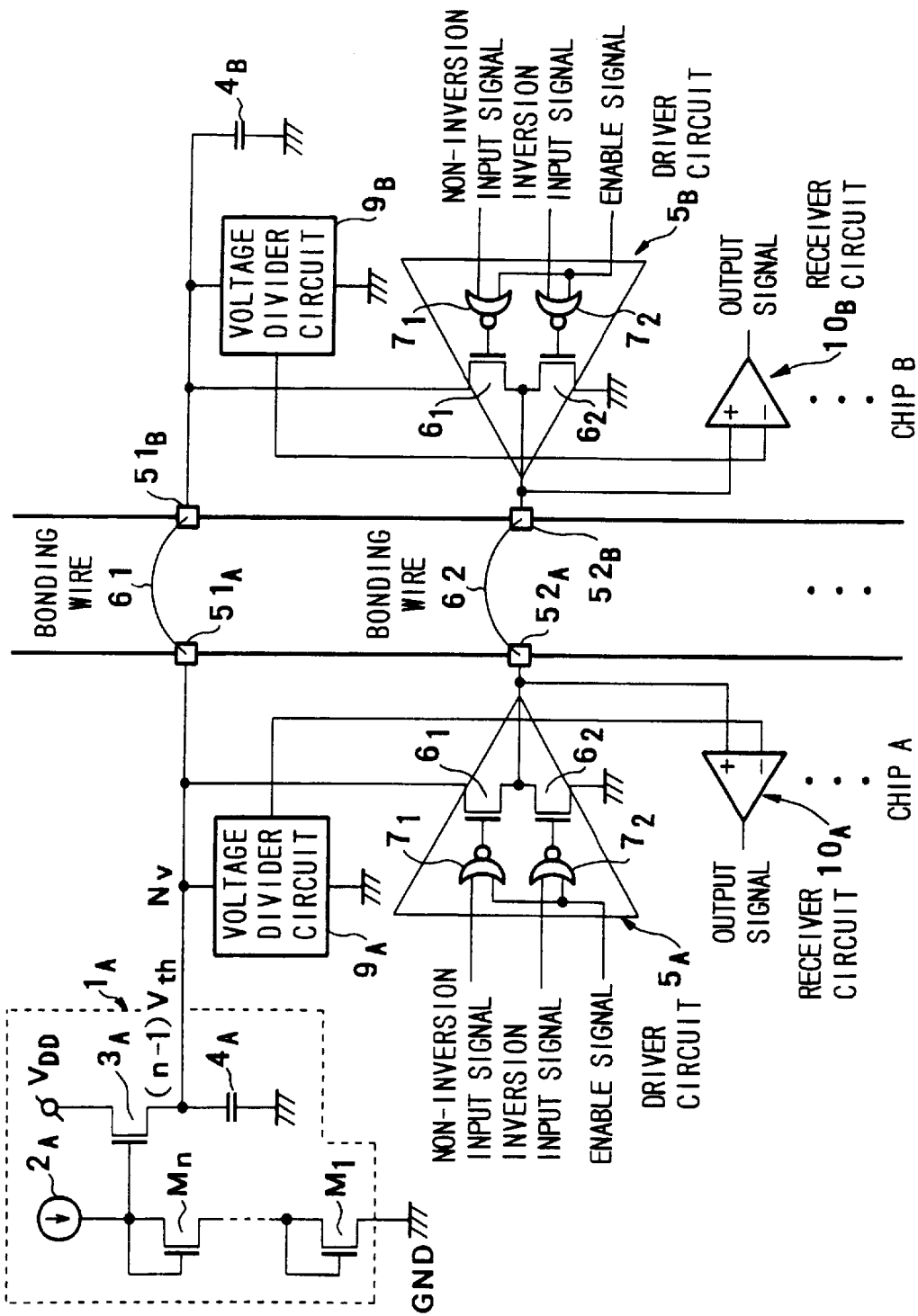
FIG. 12 is a block diagram showing a seventh embodiment of the semiconductor integrated circuit device according to the present invention.

FIG. 12 shows a seventh embodiment of the semiconductor integrated circuit device according to the present invention. In this embodiment, the semiconductor integrated circuit device comprises two semiconductor chips. Therefore, a bias circuit $1_A$, a driver circuit $5_A$, a voltage divider circuit $9_A$ and a receiver circuit $10_A$ are provided for the semiconductor chip A. Further, a capacitor $4_B$, a driver circuit $5_B$, a voltage divider circuit $9_B$ and a receiver circuit $10_B$ are provided for the semiconductor chip B.

Here, the bias circuit $1_A$, the driver circuits $5_A$ and $5_B$, and the voltage divider circuits $9_A$ and $9_B$ are the same in construction as the bias circuit 1, the driver circuit 5 and the voltage divider circuit 9 of the second embodiment, respectively.

In FIG. 12, the output terminal $N_V$ of the bias circuit $1_A$ is connected to the input terminal of the voltage divider circuit $9_A$ and further to a pad $51_A$ formed on the semiconductor chip A. Further, the input terminal of the voltage divider circuit $9_A$ and one end of the capacitor $4_B$ are connected to a pad $51_B$ formed on the chip B. These two chips A and B are arranged at the nearest possible distance and two pads $51_A$ and $51_B$ are connected to each other by a boding wire 61. Therefore, the output voltage of the bias circuit $1_A$ is applied to the voltage divider circuit $9_B$ and the capacitor $4_B$ of the chip B via the pad $51_A$, the bonding wire 61 and the pad $51_B$. Further, the capacitor $4_B$ is connected to maintain the voltage at the input terminal of the voltage divider circuit $9_B$ stably. However, this capacitor $4_B$ can be omitted.

Further, the output terminal of the driver circuit $5_A$ is connected to a pad $52_A$ formed on the chip A, and the output terminal of the driver circuit $5_B$ is connected to a pad $52_B$ formed on the chip B. These two pads $52_A$ and $52_B$ are connected to each other via a bonding wire 62. Further, the drain of the transistor $6_1$ of the driver circuit $5_B$ is connected to the pad $51_B$.

On the other hand, the receiver circuit $10_A$ detects the output of the driver circuit $5_B$ transmitted through the bonding wire 62 by the sense amplifier circuit by use of the output voltage of the voltage divider circuit $9_A$ as a reference voltage, and converts the detected output into a signal vibrating between the drive voltage $V_{DD}$ and the ground voltage GND. Further, the receiver circuit $10_B$ detects the output of the driver circuit $5_A$ transmitted through the bonding wire 62 by the sense amplifier circuit by use of the output voltage of the voltage divider circuit $9_B$ as a reference voltage, and converts the detected output into a signal vibrating between the drive voltage $V_{DD}$ and the ground voltage GND.

Accordingly, in this seventh embodiment, when the driver circuit $5_A$ is being activated, although the receiver circuit $10_B$ is also activated, the driver circuit $5_B$ and the receiver circuit $10_A$ are both deactivated. Further, when the driver circuit $5_B$ is being activated, although the receiver circuit $10_A$ is also activated, the driver circuit $5_A$ and the receiver circuit $10_B$ are both deactivated.

As described above, in this embodiment, since the signal transmitted between the two chips A and B is of small-amplitude signal, it is possible to reduce the power of the driver circuits, respectively, with the result that the power consumption of the semiconductor integrated circuit device can be minimized.

Further, in this embodiment, the small-amplitude output circuit composed of the bias circuit $1_A$ and the driver circuit $5_A$, and the small amplitude input circuit composed of the voltage divider circuit $9_A$ and the receiver circuit $10_A$ are provided on the chip A. Further, the small-amplitude output circuit composed of the driver circuit $5_B$, and the small amplitude input circuit composed of the voltage divider circuit $9_B$ and the receiver circuit $10_B$ are provided on the chip B.

Further, in this embodiment, since the two chips are arranged at the nearest possible distance and further since the two chips are connected to each other by the bonding wires, the output capacitance can be reduced. Further, even if the impedance matching is not considered between the inter-chip bonding wire and the driver circuit, a large signal reflection will not be developed.

Further, in this embodiment, the bias circuit can be formed on the chip B. In this case, the bonding wire 61 can be eliminated. Further, in this case, the same voltage supply can be used for both the chips A and B, or else two different voltage supplies can be used for both the chips A and B, respectively. Further, in the above-mentioned embodiment, although the two chips are connected to each other by use of the boding wires, it is also possible to connect the two chips directly by use of wires formed on the substrate.

8th Embodiment

Figure 13:
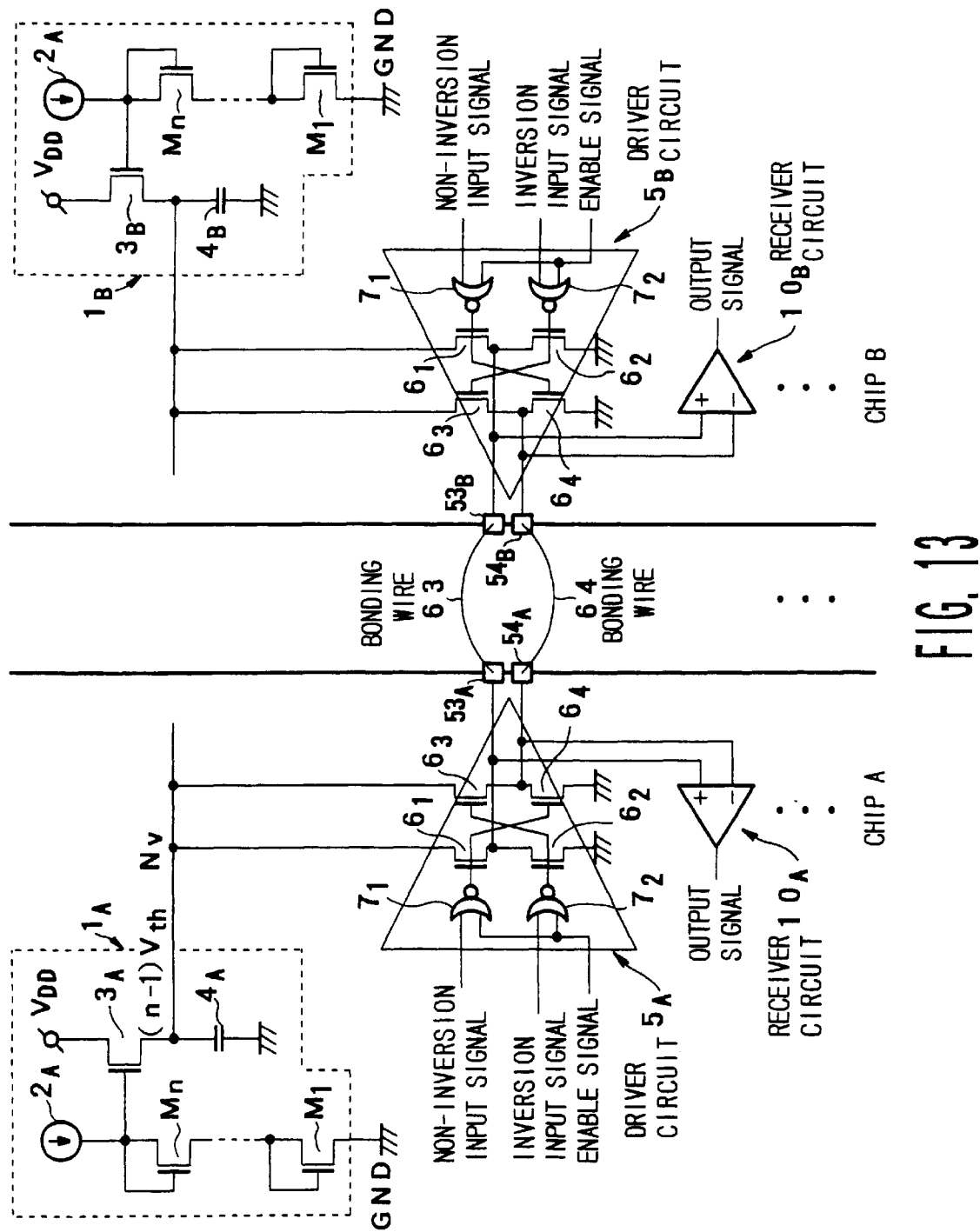
FIG. 13 is a block diagram showing an eighth embodiment of the semiconductor integrated circuit device according to the present invention.

FIG. 13 shows an eighth embodiment of the semiconductor integrated circuit device according to the present invention. In this embodiment, the small-amplitude input circuit and the small-amplitude output circuit are provided for each of the two semiconductor chips A and B arranged at the nearest possible distance. The small-amplitude output circuit of the chip A is composed of the bias circuit $1_A$ and the driver circuit $5_A$, and the small-amplitude input circuit of the chip A is composed of the receiver circuit $10_A$. Further, the small-amplitude output circuit of the chip B is composed of the bias circuit $1_B$ and the driver circuit $5_B$, and the small-amplitude input circuit of the chip B is composed of the receiver circuit $10_B$.

The circuit constructions of the bias circuits $1_A$ and $1_B$ and the driver circuits $5_A$ and $5_B$ are the same as those of the bias circuit 1 and the driver circuit 5 of the fourth embodiment shown in FIG. 5. Further, the two outputs of the driver circuit $5_A$ are connected to two pads $53_A$ and $54_A$ formed on the chip A, respectively. Further, the two outputs of the driver circuit $5_B$ are connected to two pads $53_B$ and $54_B$ formed on the chip B, respectively. The pad $53_A$ formed on the chip A and the pad $53_B$ formed on the chip B are connected to each other by a bonding wire 63, and the pad $54_A$ formed on the chip A and the pad $54_B$ formed on the chip B are connected to each other by a bonding wire 64.

On the other hand, the receiver circuit $10_A$ detects the small-amplitude differential output of the driver circuit $5_B$ transmitted through the two bonding wires 63 and 64 by the sense amplifier circuit, and converts the detected differential output into a signal vibrating between the drive voltage $V_{DD}$ and the ground voltage GND. Further, the receiver circuit $10_B$ detects the small-amplitude differential output of the driver circuit $5_A$ transmitted through the two bonding wires 63 and 64 by the sense amplifier circuit, and converts the detected differential output into a signal vibrating between the drive voltage $V_{DD}$ and the ground voltage GND.

Accordingly, in this embodiment, when the driver circuit $5_A$ is being activated, although the receiver circuit $10_B$ is also activated, the driver circuit $5_B$ and the receiver circuit $10_A$ are both deactivated. Further, when the driver circuit $5_B$ is being activated, although the receiver circuit $10_A$ is also activated, the driver circuit $5_A$ and the receiver circuit $10_B$ are both deactivated.

As described above, in this embodiment, since the signal transmitted between the two chips A and B is of small-amplitude signal, it is possible to reduce the power of the driver circuits, respectively, with the result that the power consumption of the semiconductor integrated circuit device can be minimized.

Further, in this embodiment, since the two chips are arranged at the nearest possible distance and further since the two chips are connected to each other by the bonding wires, the output capacitance can be reduced. Further, even if the impedance matching is not considered between the interchip bonding wire and the driver circuit, a large signal reflection will not be developed.

Further, in this embodiment, although the same voltage supply is used for both the chips A and B, it is also possible to use two different voltage supplies for both the chips A and B, respectively.

Further, in the seventh and eighth embodiments, the two chips A and B connected to each other by use of bonding wires can be mounted on the same lead frame base, and then sealed by use of a resin.

9th Embodiment

A ninth embodiment of the semiconductor integrated circuit device according to the present invention will be described hereinbelow with reference to FIG. 14 and FIGS. 15A and 15B.

Figure 14:
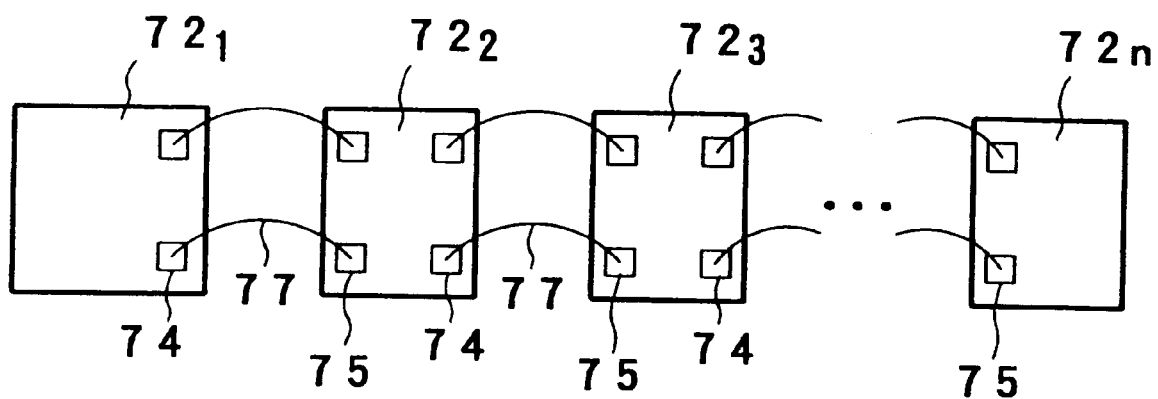
FIG. 14 is a block diagram showing a ninth embodiment of the semiconductor integrated circuit device according to the present invention.

FIG. 14 is an entire circuit construction of this embodiment, in which a plurality of semiconductor chips $72_1, \ldots, 72_n$ arranged in a line are connected to each other by use of bonding wires 77. The semiconductor chip $72_1$ has a pad 74; the semiconductor chip $72_i$ (i=2, ..., n-1) has pads 74, 75; and the semiconductor chip $72_n$ has a pad 75, respectively. Further, two adjacent semiconductor chips $72_i$ (i=2, ..., n-1) and the semiconductor chip $72_{i-1}$ are arranged at the nearest possible distance, and further the pad 74 of the semiconductor chip $72_i$ and the pad 75 of the semiconductor chip $72_{i+1}$ are connected to each other by the boding wire 77.

Figure 15A:
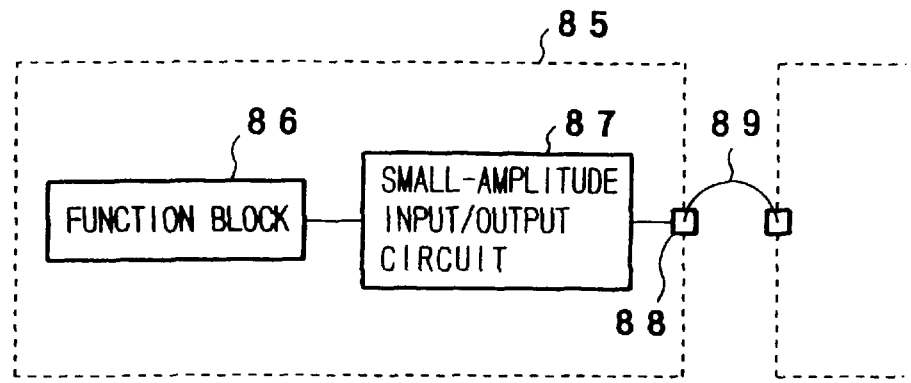
FIGS. 15A and 15B are block diagrams each showing a switch circuit related to the ninth embodiment of the semiconductor integrated circuit device according to the present invention.

Each of the semiconductor chips $72_1$ and $72_n$ arranged on both the ends is constructed as a chip 85 shown in FIG. 15A. That is, the end chip 85 is provided with a function block 86, a small-amplitude input/output circuit 87, and a pad 88. This small-amplitude input/output circuit 87 is the same as the small-amplitude input circuit and the small-amplitude output circuit of the seventh and eighth embodiments shown in FIG. 12 or FIG. 13, respectively. Further, when the small-amplitude input circuit and the small-amplitude output circuit of the eighth embodiment are used, two pads 88 are necessary.

Figure 15B:
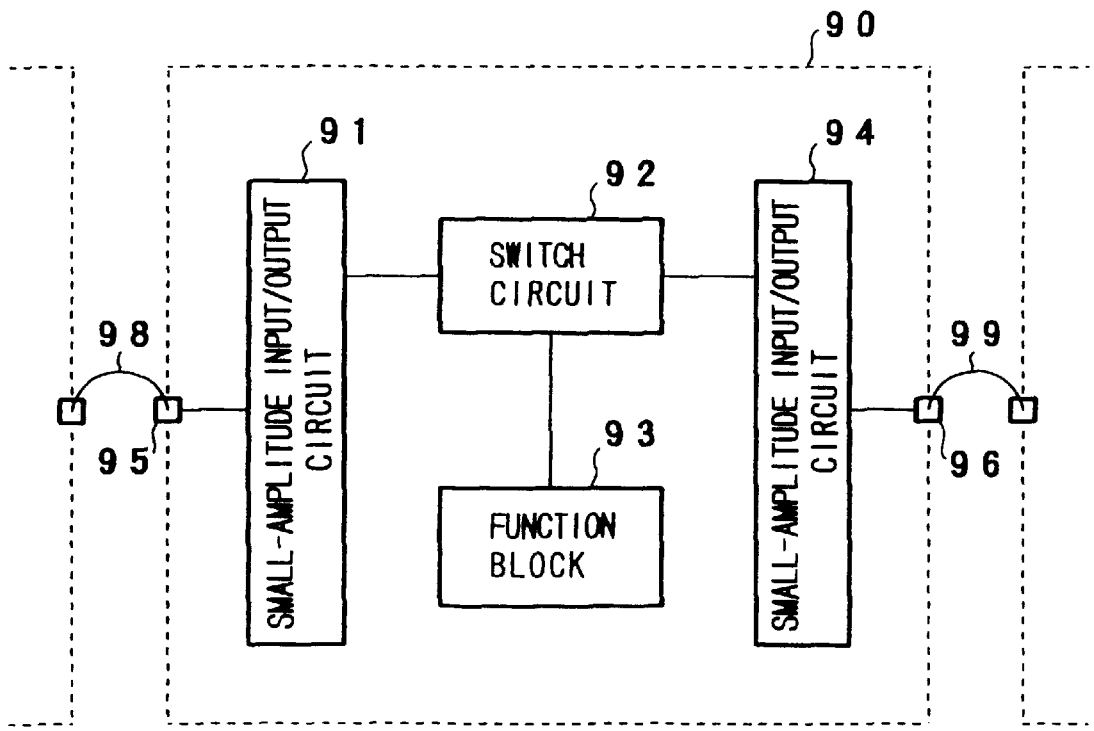

Further, each of the semiconductor chips $72_i$ (i=2, ... n-1) other than the end chips shown in FIG. 14 is constructed as a chip 90 shown in FIG. 15B. That is, the intermediate chip 90 is provided with a small-amplitude input/output circuit 91, a switch circuit 92, a function block 93, another small-amplitude input/output circuit 94, and two pads 95 and 96. The construction of the small-amplitude input/output circuits 91 and 94 is the same as that of the small-amplitude input/output circuit 87 shown in FIG. 15A.

The operation of this embodiment will be described hereinbelow.

First, in the end semiconductor chip $72_1$ or $72_n$ (85) as shown in FIG. 15A, the output signal of the function block 86 is converted into a small-amplitude signal by the small-amplitude input/output circuit 87, and then transmitted to the adjacent semiconductor chip through the pad 88 and the bonding wire 89. Further, a small-amplitude signal transmitted by the adjacent semiconductor chip through the boding wire 89 is inputted to the small-amplitude input/output circuit 87 via the pad 88, amplified into a large-amplitude signal, and then transmitted to the functional block 86.

Further, in each of the semiconductor chips $72_i$ (i=2, ... n-1) (90) other than the end chips, as shown in FIG. 15B, the small-amplitude signal transmitted from the adjacent semiconductor chip via the pad 95, for instance is amplified into a large-amplitude signal by the small-amplitude input/output circuit 91, converted into a large-amplitude signal, and then transmitted to the switch circuit 92. Further, on the basis of the control signal (not shown) applied to the switch circuit 92, the large-amplitude signal is selectively transmitted through the switch circuit 92 to the function block 93 or bypassed to the small-amplitude input/output circuit 94. The large-amplitude signal transmitted to the small-amplitude input/output circuit 94 is converted into a small-amplitude signal, and then transmitted to the adjacent semiconductor chip via the pad 96 and the bonding wire 99.

Further, the above-mentioned control signal is transmitted from the other semiconductor chip or the outside of the semiconductor integrated circuit device.

Further, when the large-amplitude signal is transmitted to the function block 93, the transmitted signal is processed. When the processed result is that the transmitted signal must be transmitted to the other semiconductor chip, the signal is transmitted to the small-amplitude input/output circuit 91 or the small-amplitude input/output circuit 94 via the switch circuit 92. Further, the transmitted signal is converted into the small-amplitude signal by the small-amplitude input/output circuit 91 or the small-amplitude input/output circuit 94, and then transmitted to the adjacent semiconductor chip via the bonding wire 98 or the bonding wire 99. Further, the function block 86 is a circuit corresponding to a CPU or a memory, which is provided with predetermined processing functions.

Further, the small-amplitude signal transmitted from the adjacent semiconductor chip via the pad 96 is amplified into a large-amplitude signal by the small-amplitude input/output circuit 94. Further, on the basis of the control signal (not shown) applied to the switch circuit 92, the large-amplitude signal is selectively transmitted through the switch circuit 92 to the function block 93 or bypassed to the small-amplitude input/output circuit 91. The large-amplitude signal transmitted to the small-amplitude input/output circuit 91 is converted into a small-amplitude signal, and then transmitted to the adjacent semiconductor chip via the pad 95 and the bonding wire 98.

As described above, in this embodiment, since the signal transmitted between the adjacent chips is of small-amplitude signal, it is possible to reduce the power of the driver circuits of the small-amplitude input/output circuits, respectively, with the result that the power consumption of the semiconductor integrated circuit device can be minimized.

Further, in this embodiment, after a plurality of the semiconductor chips have been connected to each other by bonding wires, it is possible to mount the semiconductor chips on a lead frame and to seal the mounted chips by use of a resin.

FIGS. 16A, 16B and 16C show practical constructions of the switch circuit 92 used for the ninth embodiment of the semiconductor integrated circuit device according to the present invention.

In FIG. 16A, the switch circuit 92 is composed of three switch elements 101, 102 and 103. The switch element 101 connects a node $N_1$ to a node $N_2$ on the basis of a control signal $S_{12}$ applied to the same switch element 101; the switch element 102 connects the node $N_2$ to a node $N_3$ on the basis of a control signal $S_{23}$ applied to the same switch element 102; and the switch element 103 connects the node $N_3$ to the node $N_1$ on the basis of a control signal $S_{31}$ applied to the same switch element 103.

Further, as shown in FIG. 16B, each switch-element is composed of an inverter circuit 105 and a transfer gate having a P-channel MOS transistor 106 and an N-channel MOS transistor 107. The control signal S is applied to the gate of the N-channel MOS transistor 107 and further to the gate of the P-channel MOS transistor 106 via the inverter circuit 105.

Accordingly, in FIG. 16A, when the control signal $S_{12}$ is at "1" and the other control signals $S_{23}$ and $S_{31}$ are both at "0", the node $N_1$ and the node $N_2$ are connected to each other; when the control signal $S_{23}$ is at "1" and the other control signals $S_{31}$ and $S_{12}$ are both at "0", the node $N_2$ and the node $N_3$ are connected to each other; and when the control signal $S_{31}$ is at "1" and the other control signals $S_{12}$ and $S_{23}$ are both at "0", the node $N_3$ and the node $N_1$ are connected to each other, as listed in FIG. 16C.

Figure 17:
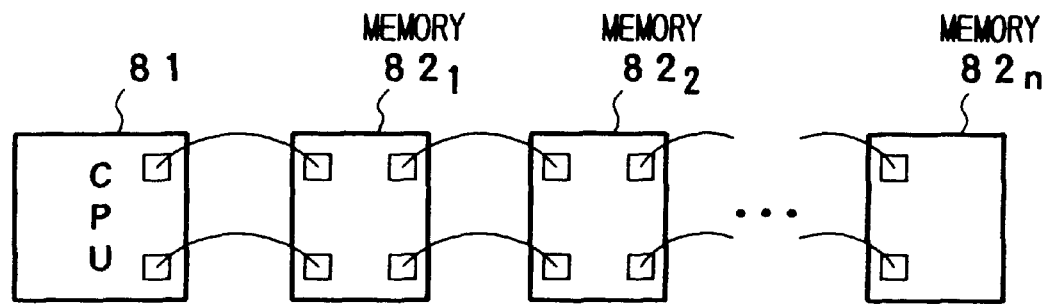
FIG. 17 is a block diagram showing a first modification of the ninth embodiment.

FIG. 17 shows a first modification of the ninth embodiment of the semiconductor integrated circuit device according to the present invention. This first modification is of single CPU semiconductor integrated circuit device, in which a semiconductor chip 81 having a CPU and a plurality of memories $82_1, \ldots, 82_n$ are arranged adjacent to each other in a line and further connected to each other by boding wires, respectively.

In this first modification, the power consumption can be reduced, and further a large amount of data can be accessed by the CPU at high speed.

Figure 18:
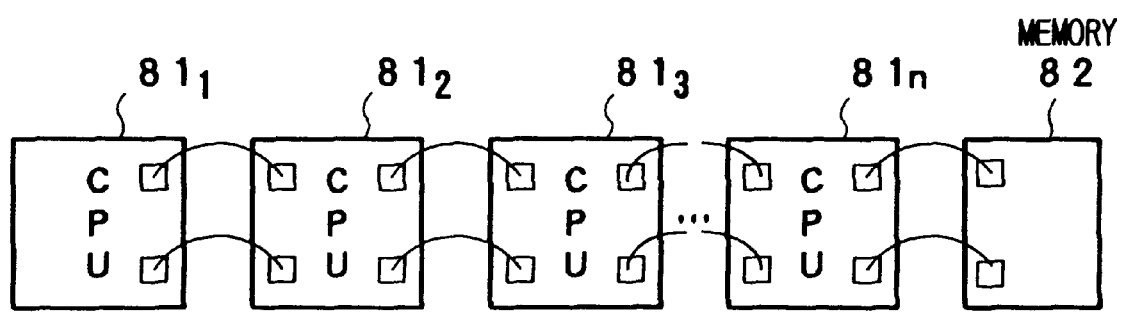
FIG. 18 is a block diagram showing a second modification of the ninth embodiment.

FIG. 18 shows a second modification of the ninth embodiment of the semiconductor integrated circuit device according to the present invention. This second modification is of multi-CPU semiconductor integrated circuit device, in which a plurality of semiconductor chips $81_1, \ldots, 81_n$ each including a CPU and a memory 82 are arranged adjacent to each other in a line and further connected to each other by boding wires.

In this second modification, the power consumption can be of course reduced.

10th Embodiment

A tenth embodiment of the semiconductor integrated circuit device according to the present invention will be described hereinbelow with reference to FIG. 19. In this embodiment, in the ninth embodiment of the semiconductor integrated circuit device shown in FIG. 14, each of the semiconductor chips $72_i$ (i=2, ..., n−1) other than the end chips shown in FIG. 14 is constructed as a chip shown in FIG. 19. That is, the intermediate chip is provided with a small-amplitude input/output circuit 91, two selectors 92a and 92b, a bus 92c, a function block 93, another small-amplitude input/output circuit 94, and two pads 95 and 96. The construction of the small-amplitude input/output circuits 91 and 94 is the same as that of the small-amplitude input/output circuit 87 shown in FIG. 15A.

The operation of this embodiment will be described hereinbelow.

Figure 19:
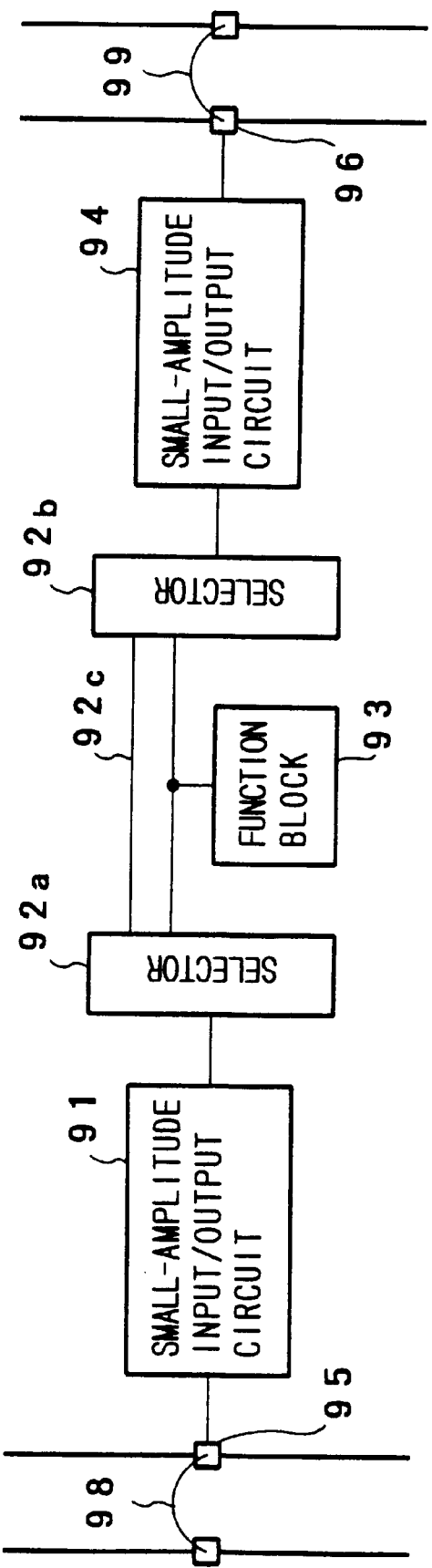
FIG. 19 is a block diagram showing a tenth embodiment of the semiconductor integrated circuit device according to the present invention.

In FIG. 19, the small-amplitude signal transmitted from the adjacent semiconductor chip via the bonding wire 98 is detected by the small-amplitude input/output circuit 91, converted into a large-amplitude signal vibrating between the drive voltage $V_{DD}$ and the ground voltage GND, for instance, and then transmitted to the selector $92_a$. Further, on the basis of the control signal (not shown) applied to the selector 92a, the large-amplitude signal is selectively transmitted through the selector 92a to the function block 93 or bypassed to the small-amplitude input/output circuit 94 via the bus 92c and the selector 92b. The large-amplitude signal transmitted to the small-amplitude input/output circuit 94 is converted into a small-amplitude signal by the small-amplitude input/output circuit 94, and then transmitted to the adjacent semiconductor chip via the pad 96 and the bonding wire 99.

Further, the small-amplitude signal transmitted from the adjacent semiconductor chip via the bonding wire 99 is detected and further converted into a large-amplitude signal by the small-amplitude input/output circuit 94 and then transmitted to the selector 92b. Further, on the basis of the control signal (not shown) applied to the selector 92b, the large-amplitude signal is selectively transmitted through the selector 92b to the function block 93 or bypassed to the small-amplitude input/output circuit 91 via the bus 92c and the selector 92a. The large-amplitude signal transmitted to the small-amplitude input/output circuit 91 is converted into a small-amplitude signal, and then transmitted to the adjacent semiconductor chip via the pad 95 and the bonding wire 98.

In this embodiment, since the transmitted signals are of small-amplitude signal, it is possible to reduce the power consumption of the driver circuits of the small-amplitude input/output circuits, respectively, with the result that the semiconductor integrated circuit device can be minimized.

11th Embodiment

Figure 20:
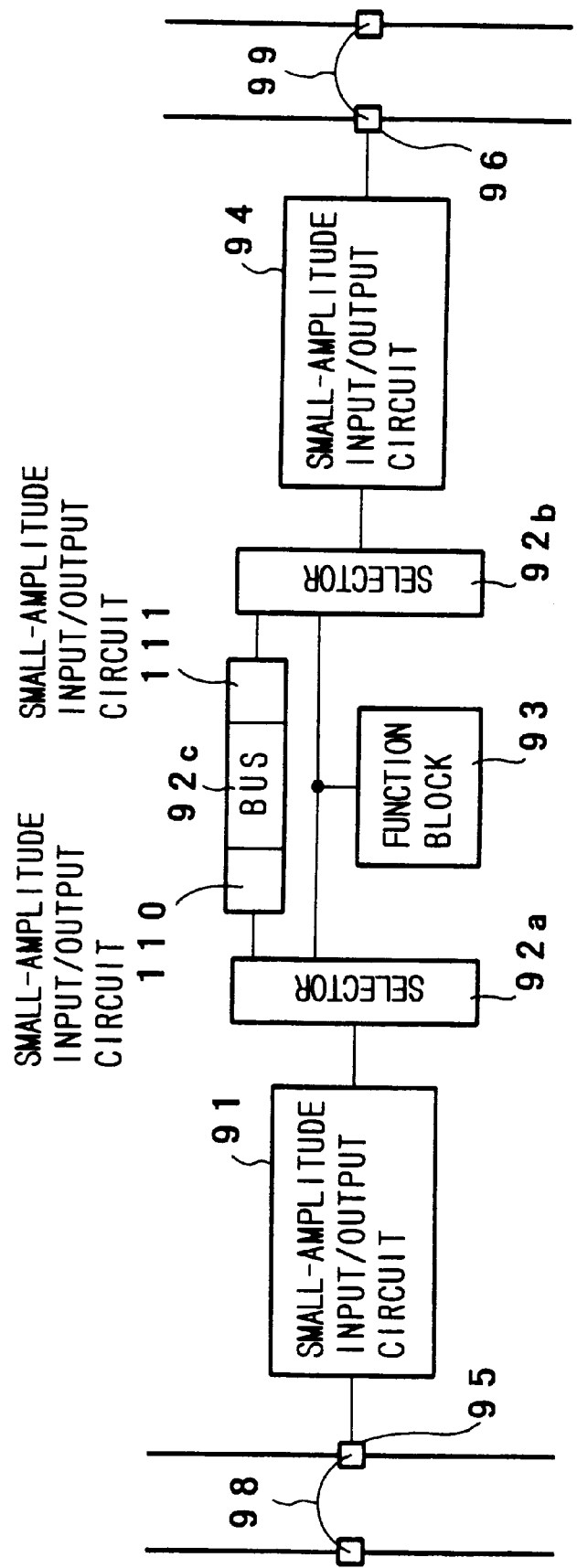
FIG. 20 is a block diagram showing an eleventh embodiment of the semiconductor integrated circuit device according to the present invention.

FIG. 20 shows an eleventh embodiment of the semiconductor integrated circuit device according to the present invention. This embodiment is different from the tenth embodiment shown in FIG. 19 in that two small-amplitude input/output circuits 110 and 111 are additionally connected on both ends of the bypassing bus 92c. This embodiment is effective when the capacitance of the bypass 92C is large. In this construction, it is of course possible to reduce the power consumption of the semiconductor integrated circuit device.

12th Embodiment

Figure 21:
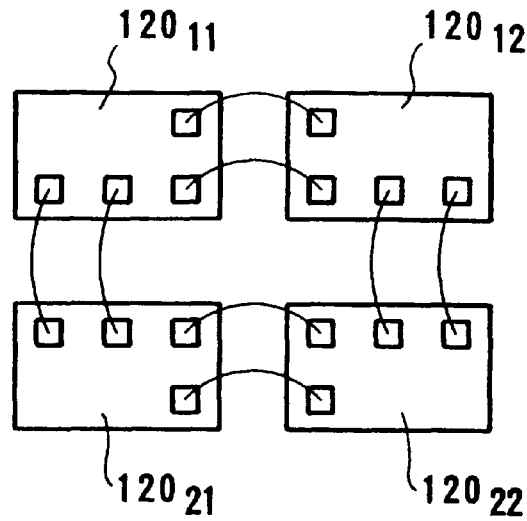
FIG. 21 is a block diagram showing a twelfth embodiment of the semiconductor integrated circuit device according to the present invention.

FIG. 21 shows a twelfth embodiment of the semiconductor integrated circuit device according to the present invention. In this embodiment, four semiconductor chips $120_{11}$, $120_{12}$, $120_{13}$, and $120_{22}$ are arranged in a matrix pattern and further connected to each other by bonding wires.

Each semiconductor chips $120_{ij}$ (i, j=1 and 2) are constructed as shown in FIG. 15B. In more detail, each semiconductor chip is composed of the two small-amplitude input/output circuits 91 and 94, the switch circuit 92, the function block 93, and the two pads 95 and 96. Therefore, since the signals transmitted between the semiconductor chips are of small-amplitude signal, it is possible to reduce the power of the driver circuit of the small-amplitude input/output circuit and thereby to minimize the power consumption thereof.

Further, in the this embodiment, after a plurality of the semiconductor chips have been connected to each other by bonding wires, it is possible to mount the semiconductor chips on the same lead frame and to seal the mounted chips by use of a resin.

13th Embodiment

Figure 22:
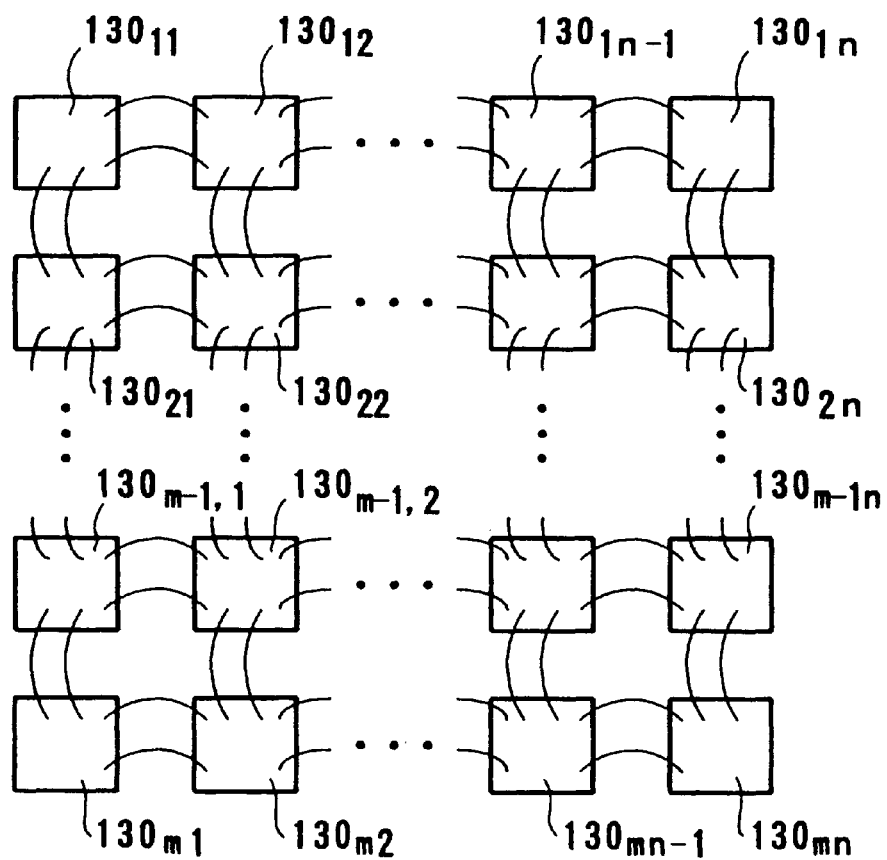
FIG. 22 is a block diagram showing a thirteenth embodiment of the semiconductor integrated circuit device according to the present invention.

FIG. 22 shows a thirteenth embodiment of the semiconductor integrated circuit device according to the present invention. In this embodiment, a plurality of semiconductor chips $130_{11}$, $130_{12}$, ..., $130_{mn}$ arranged in a matrix pattern (m×n units) are connected to each other by bonding wires. Here, each of the four corner semiconductor chips $130_{11}$, $130_{1n}$, $130_{m1}$ and $130_{mn}$ arranged at four corners of the matrix pattern is constructed as shown in FIG. 15B.

Figure 23A:
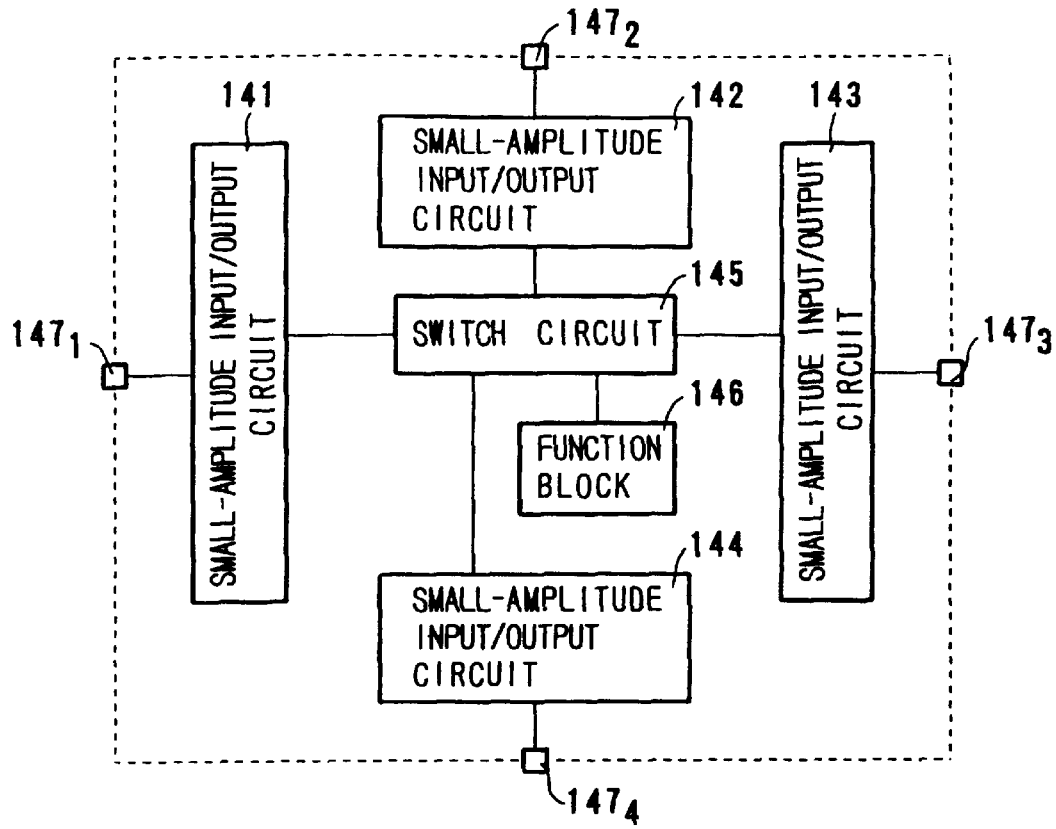
FIGS. 23A and 23B are block diagrams each showing a semiconductor chip related to the thirteenth embodiment according to present invention.
Figure 23B:
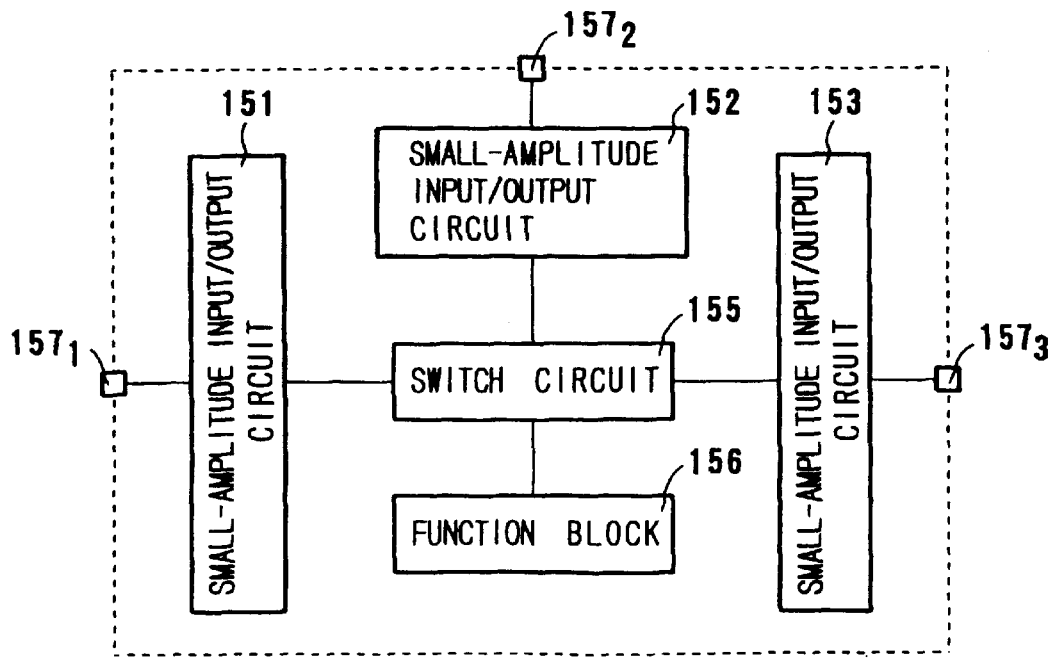

Further, the other semiconductor chips $130_{i1}$ (i=2, ..., m-1), $130_{1j}$ (j=2, ..., n-1), $130_{mk}$ (k=2, ..., n-1) and $130_{gn}$ (g=2, ..., m-1) all arranged on each side of the matrix pattern are constructed as shown in FIG. 23B. In more detail, each of the semiconductor chips comprises three small-amplitude input/output circuits 151, 152 and 153; a switch circuit 155, a function block 156, three pads $157_1$, $157_2$ and $157_3$. The pad $157_1$ is connected to the small-amplitude input/output circuit 151; the pad $157_2$ is connected to the small-amplitude input/output circuit 152; and the pad $157_3$ is connected to the small-amplitude input/output circuit 153. These pads $157_i$ (i=1, 2 and 3) are all connected to each adjacent semiconductor chip via a bonding wire.

The small-amplitude signals each transmitted from each adjacent semiconductor chip via each of the pads $157_i$ is detected by each of the small-amplitude input/output circuits 151, 152 and 153, converted into a large-amplitude signal vibrating between the drive voltage $V_{DD}$ and the ground voltage GND, for instance, and then transmitted to the switch circuit 155. Further, on the basis of the control signal (not shown) applied to the switch circuit 155, the large-amplitude signal is selectively transmitted through the switch circuit 155 to the function block 156 or bypassed to the other small-amplitude input/output circuit. The large-amplitude signal transmitted to the small-amplitude input/output circuit is converted into a small-amplitude signal, and then transmitted to the adjacent semiconductor chip via the corresponding pad and bonding wire.

When the large-amplitude signal is transmitted to the function block 156, the transmitted large-amplitude signal is processed. The output of the function block 156 is transmitted to the small-amplitude input/output circuit via the switch circuit, converted into a small-amplitude signal, and then transmitted to the adjacent semiconductor chip via the corresponding pad.

Further, each of the semiconductor chips $130_{ij}$ (i=2, ..., m-1, j=2, ..., n-1) is constructed as shown in FIG. 23A. In more detail, each of the semiconductor chips comprises four small-amplitude input/output circuits 141, 142, 143 and 144; a switch circuit 145, a function block 146, and pads $147_i$ (i=1, ..., 4). The pad $147_1$ is connected to the small-amplitude input/output circuit 141 and further connected to the adjacent semiconductor chip via a bonding wire; the pad $147_2$ is connected to the small-amplitude input/output circuit 142 and further connected to the adjacent semiconductor chip via a bonding wire; the pad $147_3$ is connected to the small-amplitude input/output circuit 143 and further connected to the adjacent semiconductor chip via a bonding wire; and the pad $147_4$ is connected to the small-amplitude input/output circuit 144 and further connected to the adjacent semiconductor chip via a bonding wire.

The small-amplitude signal transmitted from the adjacent semiconductor chip via the pads is detected and further converted into a large-amplitude signal and then transmitted to the switch circuit 145. Further, on the basis of the control signal (not shown) applied to the switch circuit 145, the large-amplitude signal is selectively transmitted through the switch circuit 145 to the function block 146 or bypassed to the other small-amplitude input/output circuit. The large-amplitude signal transmitted to the small-amplitude input/output circuit is converted into a small-amplitude signal, and then transmitted to the adjacent semiconductor chip via the corresponding pad and bonding wire.

When the large-amplitude signal is transmitted to the function block 146, the transmitted large-amplitude signal is processed. The output of the function block 146 is transmitted to the small-amplitude input/output circuit via the switch circuit 145, converted into a small-amplitude signal, and then transmitted to the adjacent semiconductor chip via the corresponding pad.

As described above, in this embodiment, since the signal transmitted between the chips is of small-amplitude signal, it is possible to reduce the power of the driver circuits of the small-amplitude input/output circuits, respectively, with the result that the power consumption of the semiconductor integrated circuit device can be minimized.

Further, in this thirteenth embodiment, when m is set to 1, this is the same as with the case of the ninth embodiment shown in FIG. 14.

Figure 24:
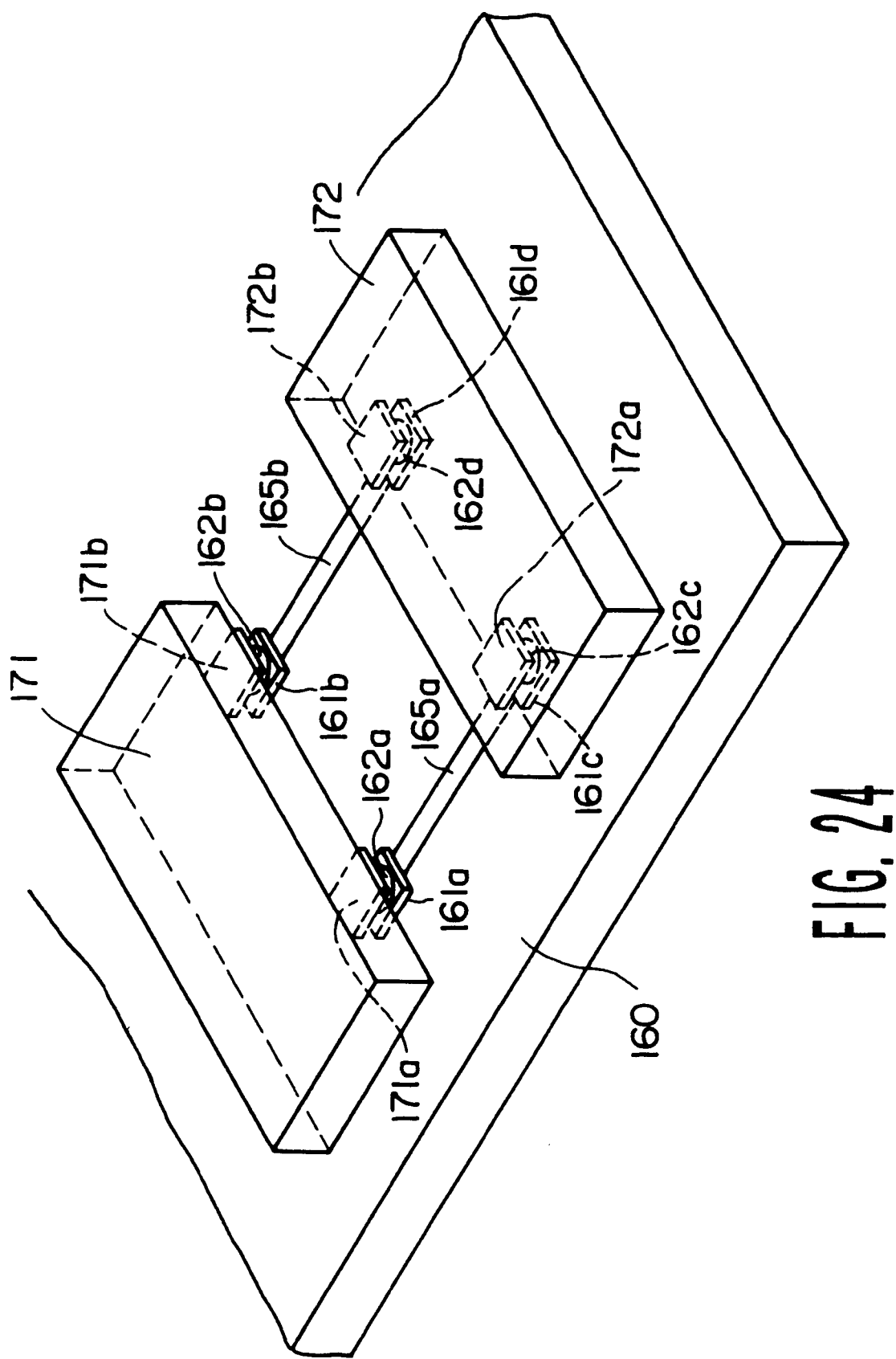
FIG. 24 is a perspective view showing substrate wires.

Further, in the ninth to thirteenth embodiments, although the chips are connected by use of bonding wires, it is also possible to connect these chips directly by use of substrate wires. In this case, as shown in FIG. 24, pads 161a, 161b, 161c and 161d are formed on a package substrate 160; and further bumps 162a, 162b, 162c and 162d are formed on these pads, respectively.

The pad 161a and the pad 161c are connected to each other by a substrate wire 165a, and the pad 161b and the pad 161d are connected to each other by a substrate wire 165b. Further, pads 171a and 171b are formed on the surface of a semiconductor chip 171, and pads 172a and 172b are formed on the surface of another semiconductor chip 172. Further, the pads 171a and 171b formed on the semiconductor chip 171 are connected to the pads 161a and 161b formed on the package substrate 160 via the bumps 162a and 162b, respectively; and the pads 172a and 172b formed on the semiconductor chip 172 are connected to the pads 161c and 161d formed on the package substrate 160 via the bumps 162c and 162d, respectively. As described above, it is possible to connect the semiconductor chips by use of the substrate wires 165a and 165b.

14th Embodiment

Figure 25:
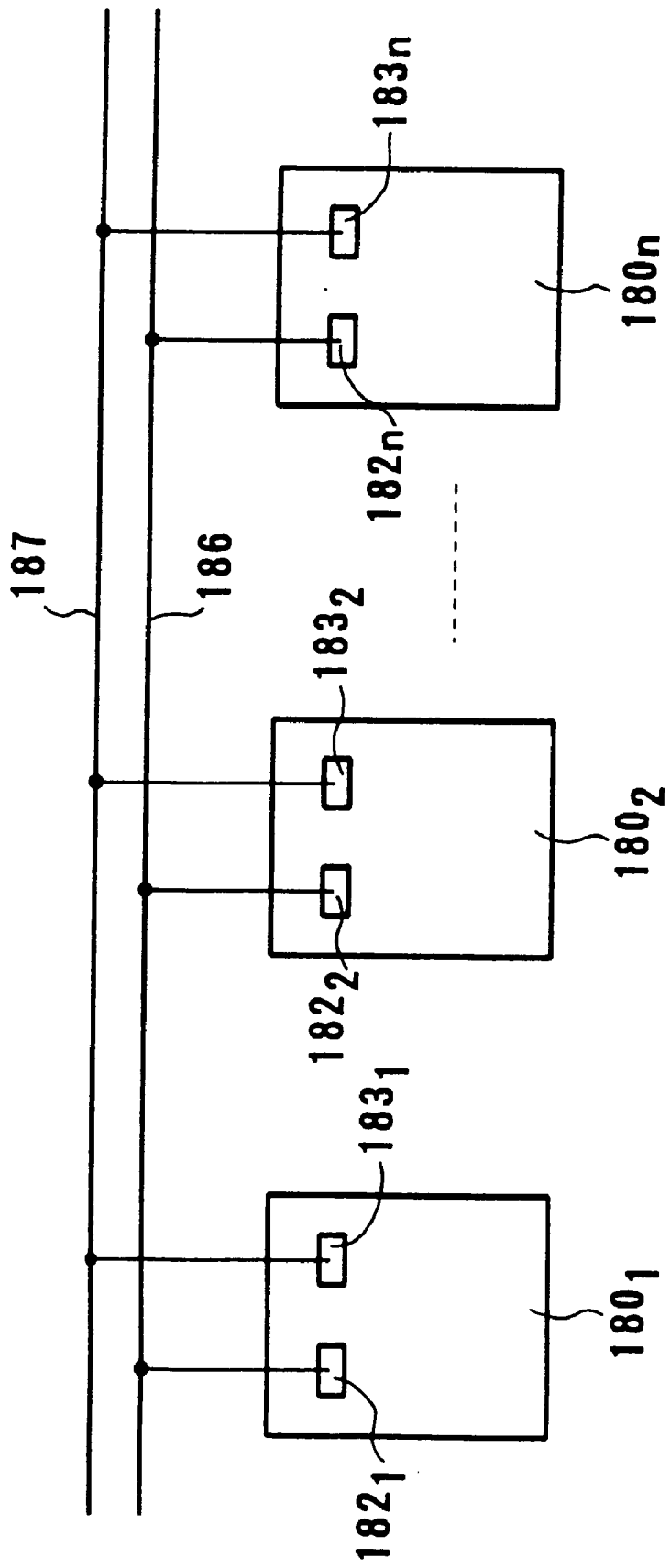
FIG. 25 is a block diagram showing fourteenth embodiment of the semiconductor integrated circuit device according to the present invention.

FIG. 25 shows a fourteenth embodiment of the semiconductor integrated circuit device according to the present invention, in which a plurality of semiconductor chips $180_1, \ldots, 180_n$ arranged in a line on the same plane are connected to each other through two buses 186 and 187. Each semiconductor chip $180_i$ (i=1, ..., n) has a pad $182_i$ and $183_i$. Each pad $182_i$ (i=1, ..., n) is connected to the bus 186, and each pad $183_i$ (i=1, ..., n) is connected to the bus 187.

Further, at least one of a plurality of the semiconductor chips $180_1, \ldots, 180_n$, for instance, the semiconductor chip $180_1$ is provided with a small-amplitude output circuit composed of the bias circuit $1_A$ and the driver circuit $5_A$, and the small-amplitude input circuit composed of the voltage divider circuit $9_A$ and the receiver circuit $10_A$, in the same way as with the case of the semiconductor chip A of the seventh embodiment shown in FIG. 12. The output terminal of the voltage divider circuit $9_A$ is connected to the pad $182_1$, and the output terminal of the driver circuit $5_A$ is connected to the pad $183_1$.

Further, the other semiconductor chips $180_i$ (i≠1) are provided with a small-amplitude output circuit composed of the driver circuit $5_B$, and the small-amplitude input circuit composed of the voltage divider circuit $9_B$ and the receiver circuit $10_B$ respectively, in the same way as with the case of the semiconductor chip B of the seventh embodiment shown in FIG. 12. The output terminal of the voltage divider circuit $9_B$ is connected to the pad $182_i$, and the output terminal of the driver circuit $5_B$ is connected to the pad $183_i$.

In this fourteenth embodiment, since the signals transferred between the semiconductor chips are of small-amplitude signal, in the same way as with the case of the seventh embodiment, it is possible to reduce the power of the driver circuits, so that the power consumption thereof can be minimized. In addition, in this embodiment, since the semiconductor chips are connected through the two buses, it is possible to transmit signals at a high speed by a small power. Further, signals transmitted from one chip can be received by the other chips at the same time.

15th Embodiment

Figure 26:
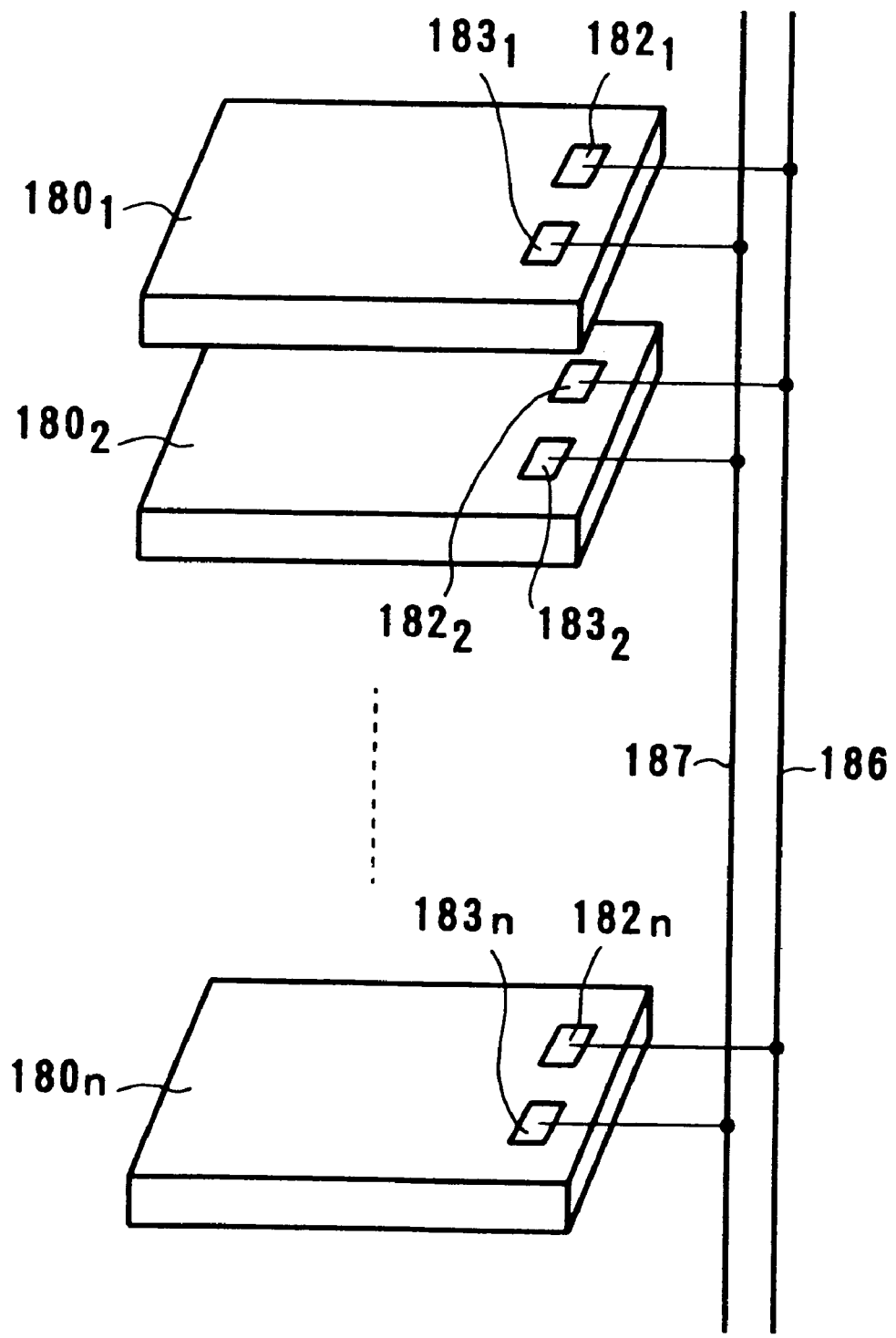
FIG. 26 is a block diagram showing a fifteenth embodiment of the semiconductor integrated circuit device according to the present invention.

FIG. 26 shows a fifteenth embodiment of the semiconductor integrated circuit device according to the present invention, in which a plurality of the semiconductor chips $180_1, \ldots 180_n$ arranged in the fourteenth embodiment shown in FIG. 25 are laminated one upon another. This structure is referred to as a multi-chip semiconductor device.

In this fifteenth embodiment, it is of course possible to obtain the same effect as with the case of the four-teenth embodiment.

Further, in this fifteenth embodiment, although the buses 186 and 187 are both arranged on the outside of each semiconductor chip $180_i$ (i=1, ..., n), it is also possible to arranged the two buses so as to pass through the semiconductor chips $180_i$ (i=1, ..., n), respectively. In this case, the buses 186 and 187 are constructed by junction wires for connecting the respective chips.

Further, in the above-mentioned fourteenth and fifteenth embodiments, it is possible to provide the bias circuit on the other semiconductor chip $180_i$ (i≠1) on which no bias circuit is provided. In this case, the pads $182_1, \ldots, 182_n$ and the bus 186 can be eliminated. Further, in this case, the same voltage supply or different voltage supplies can be used for the semiconductor chips $180_i$ (i=1, ..., n). Further, in the above-mentioned fourteenth and fifteenth embodiments, although each semiconductor chip $180_i$ (i=1, ..., n) is provided with the small-amplitude output circuit and the small-amplitude input circuit, in the same way as with the case of the seventh embodiment, it is also preferable that each semiconductor chip $180_i$ (i=1, ..., n) is provided with the small-amplitude output circuit and the small-amplitude input circuit, in the same way as with the case of the eighth embodiment shown in FIG. 13. In more detail, in this case, each semiconductor chip $180_i$ (i=1, ..., n) is provided a small-amplitude output circuit composed of the bias circuit $1_A$ and the driver circuit $5_A$, and the small-amplitude input circuit composed of the receiver circuit $10_A$, as shown in FIG. 13. In addition, one of the two output ends of the driver circuit $5_A$ is connected to the pad $182_i$, and the other of the two output ends thereof is connected to the pad $183_i$. Further, in the first to ninth embodiments, although the bias circuit is constructed by the N-channel transistors, it is of course possible to construct the bias circuit by use of P-channel transistors. In this case, the drive voltage $V_{DD}$ and the ground voltage GND must be reversed with respect to each other. As described above, in the semiconductor integrated circuit device according to the present invention, since the signals flowing through the transfer path (e.g., bus) are of small-amplitude signal, the power of the driver circuits for driving the transfer path can be reduced, with the result that the power consumption of the semiconductor integrated circuit can be minimized.

What is claimed is:

1. A semiconductor integrated circuit device, which comprises: a plurality of semiconductor chips arranged in a matrix pattern, each semiconductor chip including:
input/output ends connected to input/output ends of another adjacent semiconductor chip by transfer wires of bonding wires or substrate wires, respectively, for transferring data; and
a small-amplitude input/output circuit arranged in each of the input/output ends of a part or all of said semiconductor chips, for receiving a non-inversion signal and an inversion signal each vibrating between a first supply voltage and a second supply voltage according to each semiconductor chip including the small-amplitude input/output circuit, for converting the received signals into a small-amplitude signal vibrating between a predetermined voltage fixed between the first and second supply voltages and the first supply voltage, for outputting the converted signal to the input/output end of another adjacent semiconductor chip via the transfer wire, and for converting the small-amplitude signal transferred via the transfer wire into a signal vibrating between the first supply voltage and the second supply voltage.

2. The semiconductor integrated circuit device of claim 1, wherein said small-amplitude input/output circuit comprises:
   a bias circuit for generating a predetermined voltage fixed between a first supply voltage and a second supply voltage;
   a driver circuit for receiving an inversion input signal and a non-inversion input signal each vibrating between the first and second supply voltages, for converting the received input signal into a signal vibrating between an output voltage of said bias circuit and the first supply voltage on the basis of an enable signal, and for driving the transfer wire by the converted signal or for setting an output thereof to a high impedance;
   a voltage divider circuit for dividing an output voltage of said bias circuit; and
   a receiver circuit for detecting the signal transferred via the transfer wire by use of an output of said voltage divider circuit as a reference voltage, and for converting the detected signal into a signal vibrating between the first supply voltage and the second supply voltage.

3. The semiconductor integrated circuit device of claim 1, wherein said small-amplitude input/output circuit comprises:
   a bias circuit for generating a predetermined voltage fixed between a first supply voltage and a second supply voltage;
   a driver circuit for receiving an inversion input signal and a non-nversion input signal each vibrating between the first and second supply voltages, for converting the received input signals into two differential signals each vibrating between an output voltage of said bias circuit and the first supply voltage on the basis of an enable signal, and for driving the transfer wire by the converted differential signals or for setting an output thereof to a high impedance; and
   a receiver circuit for detecting the differential signals transferred via the transfer wire, and for converting the detected differential signals into a signal vibrating between the first supply voltage and the second supply voltage.

4. A semiconductor integrated circuit device, comprising:
first to n-th semiconductor chips arranged in a line,
   said first semiconductor chip including:
      first functioning means having predetermined processing functions;
      a first input/output end for transferring data; and
      a first small-amplitude input/output circuit for converting an output of said first functioning means into a small-amplitude signal having an amplitude smaller than that of the output signal of said first functioning means, for transferring the converted small-amplitude signal to the adjacent second semiconductor chip via said first input/output end, for converting a small-amplitude signal transferred from the second semiconductor chip via said first input/output end into a large-amplitude signal having an amplitude larger than that of the transferred small-amplitude signal, and for transferring the converted large-amplitude signal to said first functioning means;
   said i-th (i=2, . . . , n-1) semiconductor chip including:
      i-th functioning means having predetermined processing functions;
      2(i-1)-th and (2i-1)-th input/output ends each for transferring data;
      2(i-1)-th and (2i-1)-th small-amplitude input/output circuits; and
      an (i-1)-th switch circuit;
      said (i-1)-th switch circuit transferring an output of said i-th functioning means to the 2(i-1)-th or the (2i-1)-th small-amplitude input/output circuit on the basis of a control signal, and selectively outputting an output of one of the 2(i-1)-th and (2i-1)-th small-amplitude input/output circuits to the i-th functioning means or bypasses the same output to the other of the 2(i-1)-th and the (2i-1)-th small-amplitude input/output circuits on the basis of the same control signal;
      the 2(i-1)-th small-amplitude input/output circuit converting an output of said (i-1)-th switch circuit into a small-amplitude signal having an amplitude smaller than that of the output signal, transferring the converted small-amplitude signal to the (i-1)-th semiconductor chip via said 2(i-1)-th input/output end, converting a small-amplitude signal transferred from the (i-1)-th semiconductor chip via the 2(i-1)-th input/output end into a large-amplitude signal having an amplitude larger than that of the transferred signal, and transferring the converted large-amplitude signal to said (i-1)-th switch circuit; and
      the (2i-1)-th small-amplitude input/output circuit converting an output of said (i-1)-th switch circuit into a small-amplitude signal having an amplitude smaller than that of the output signal, transferring the converted small-amplitude signal to the (i+1)-th semiconductor chip via said (2i-1)-th input/output end, converting a small-amplitude signal transferred from the (i+1)-th semiconductor chip via the (2i-1)-th input/output end into a large-amplitude signal having an amplitude larger than that of the transferred signal, and transferring the converted large-amplitude signal to said (i-1)-th switch circuit;
   said n-th semiconductor chip including:
      n-th functioning means having predetermined processing functions;
      2(n-1)-th input/output end for transferring data; and
      2(n-1)-th small-amplitude input/output circuit for converting an output of said n-th functioning means into a small-amplitude signal having an amplitude smaller than that of the output, for transferring the converted signal to the adjacent (n-1)-th semiconductor chip via the 2(n-1)-th input/output end, for converting the small-amplitude signal transferred from the (n-1)-th semiconductor chip via the 2(n-1)-th input/output end into a large-amplitude signal having an amplitude larger than that of the small-amplitude signal, and for transferring the converted signal to the n-th functioning means; and
      the (2i-1)-th input/output end of said i-th (i=1, . . . , n-1) semiconductor chip being connected to the 2i-th input/output end of said (i+1)-th semiconductor ship by a transfer wire of bonding wire or a substrate wire.

5. The semiconductor integrated circuit device of claim 4, wherein said i-th (i=1, . . . , n-2) switch circuit comprises:
   a first switch element for connecting the 2i-th small-amplitude input/output circuit to the (i+1)-th functioning means on the basis of a first control signal;

a second switch element for connecting the (i+1)-th functioning means to the (2i+1)-th small-amplitude input/output circuit on the basis of a second control signal;

a third switch element for connecting the 2i-th small-amplitude input/output circuit to the (2i+1)-th small-amplitude input/output circuit on the basis of a third control signal; and the j-th (j=1, 2 and 3) switch elements each including a transfer gate composed of:
an N-channel MOS transistor having a gate for receiving the j-th control signal;
a P-channel MOS transistor having a gate for receiving an inversion signal of the j-th control signal; and
when any one of the first to third control signals is at a high level, the two remaining control signal being at a low level, respectively.

6. The semiconductor integrated circuit device of claim 4, wherein said first semiconductor chip comprises a CPU, and said second to n-th semiconductor chips comprise a memory, respectively.

7. The semiconductor integrated circuit device of claim 4, wherein said first to (n−1)-th semiconductor chips comprise a CPU, respectively, and said n-th semiconductor chip comprises a memory.

8. A semiconductor integrated circuit device, comprising:
first to n-th semiconductor chips arranged in a line, said first semiconductor chip including:
first functioning means having predetermined processing functions;
a first input/output end for transferring data; and
a first small-amplitude input/output circuit for converting an output of said first functioning means into a small-amplitude signal having an amplitude smaller than that of the output signal, for transferring the converted small-amplitude signal to the adjacent second semiconductor chip via said first input/output end, for converting a small-amplitude signal transferred from the second semiconductor chip via the first input/output end into a large-amplitude signal having an amplitude larger than that of the transferred small-amplitude signal, and for transferring the converted large-amplitude signal to said first functioning means;

said i-th (i=2, . . . , n−1) semiconductor chip including:
i-th functioning means having predetermined processing functions;
2(i−1)-th and (2i−1)-th input/output ends each for transferring data;
2(i−1)-th and (2i−1)-th small-amplitude input/output circuits; and
2(i−1)-th and (2i−1)-th selector circuits; and
said 2(i−1)-th small-amplitude input/output circuit converting a small-amplitude signal transferred from the adjacent (i−1)-th semiconductor chip via the (2−i1)-th input/output end into a large-amplitude signal having an amplitude larger than that of the small-amplitude signal, transferring the converted signal to the 2(i−1)-th selector circuit, converting the signal transferred from the 2(i−1)-th selector circuit into a signal having an amplitude smaller than that of the selector signal, and transferring the converted signal to the (i−1)-th semiconductor chip via the 2(i−1)-th input/output end;

said (2i−1)-th small-amplitude input/output circuit converting a small-amplitude signal transferred from the adjacent (i+1)-th semiconductor chip via the (2−i1)-th input/output end to a large-amplitude signal having an amplitude larger than that of the small-amplitude signal, transferring the converted signal to the (2i−1)-th selector circuit, converting the signal transferred from the (2i−1)-th selector circuit into a signal having an amplitude smaller than that of the selector signal, and transferring the converted signal to the (i+1)-th semiconductor chip via the (2i−1)-th input/output end;

the 2(i−1)-th selector circuit transferring an output of the i-th functioning means and a signal of the (2i−1)-th selector circuit to the 2(i−1)-th small-amplitude input/output circuit, and selectively transferring a signal from the 2(i−1)-th small-amplitude input/output circuit to the i-th functioning means or the (2i−1)-th selector circuit on the basis of a control signal;

the (2i−1)-th selector circuit transferring an output of the i-th functioning means and a signal of the 2(i−1)-th selector circuit to the (2i−1)-th small-amplitude input/output circuit, and selectively transferring a signal from the (2i−1)-th small-amplitude input/output circuit to the i-th functioning means or the 2(i−1)-th selector circuit on the basis of the control signal;

said n-th semiconductor chip including:
n-th functioning means having predetermined processing functions;
2(n−1)-th input/output end for transferring data; and
2(n−1)-th small-amplitude input/output circuit for converting an output of said n-th functioning means into a small-amplitude signal having an amplitude smaller than that of the output, for transferring the converted signal to the adjacent (n−1)-th semiconductor ship vial the 2(n−1)-th input/output end, for converting the small-amplitude signal transferred from the (n−1)-th semiconductor chip via the 2(n−1)-th input/output end into a large-amplitude signal having an amplitude larger than that of the small-amplitude signal, and for transferring the converted signal to the n-th functioning means.

9. The semiconductor integrated circuit device of claim 8, wherein said first semiconductor chip comprises a CPU, and said second to n-th semiconductor chips comprise a memory, respectively.

10. The semiconductor integrated circuit device of claim 8, wherein said first to (n−1)-th semiconductor chips comprise a CPU, respectively, and said n-th semiconductor chip comprises a memory.

* * * * *